US00RE42916E

(19) United States
(12) Reissued Patent
Watson

(10) Patent Number: US RE42,916 E
(45) Date of Reissued Patent: Nov. 15, 2011

(54) SINGLE BAR TYPE VIBRATING ELEMENT ANGULAR RATE SENSOR SYSTEM

(75) Inventor: William S. Watson, Eau Claire, WI (US)

(73) Assignee: Watson Industries, Inc., Eau Claire, WI (US)

(21) Appl. No.: 11/030,713

(22) Filed: Jan. 6, 2005

Related U.S. Patent Documents

Reissue of:
(64) Patent No.: 5,430,342
Issued: Jul. 4, 1995
Appl. No.: 08/053,779
Filed: Apr. 27, 1993

(51) Int. Cl.
*H01L 41/08* (2006.01)

(52) U.S. Cl. ..... 310/316.01; 310/318; 310/332; 310/351; 310/352; 73/504.14

(58) Field of Classification Search ..... 310/316.01, 310/318, 329, 332, 351, 352, 353, 366; 73/504.14
See application file for complete search history.

(56) References Cited

U.S. PATENT DOCUMENTS

| | | | | | |
|---|---|---|---|---|---|
| RE22,409 | E | * | 12/1943 | Lyman et al. | 73/504.15 |
| 2,410,825 | A | * | 11/1946 | Lane | 310/352 |
| 2,455,939 | A | * | 12/1948 | Meredith | 73/504.15 |
| 2,513,340 | A | * | 7/1950 | Lyman | 73/504.16 |
| 2,544,646 | A | * | 3/1951 | Barnaby et al. | 73/504.15 |
| 2,614,416 | A | * | 10/1952 | Hollmann | 73/862.68 |
| 2,716,893 | A | * | 9/1955 | Birdsall | 74/5.6 D |
| 2,817,779 | A | * | 12/1957 | Barnaby et al. | 310/25 |
| 2,830,274 | A | * | 4/1958 | Rosen et al. | 310/358 |
| 2,948,867 | A | * | 8/1960 | Mattiat | 333/191 |
| 2,974,530 | A | * | 3/1961 | Jaouen | 73/504.15 |
| 3,054,915 | A | * | 9/1962 | Houck | 310/326 |
| 3,113,223 | A | * | 12/1963 | Smith et al. | 310/329 |
| 3,127,775 | A | * | 4/1964 | Hansen et al. | 73/504.16 |
| 3,141,100 | A | * | 7/1964 | Hart | 310/323.01 |

(Continued)

FOREIGN PATENT DOCUMENTS

GB 1540279 * 2/1979

(Continued)

OTHER PUBLICATIONS

"Vibratory Gyroscope Using Piezoelectrically Driving Metal Bar", Murata; No Date Given.*

(Continued)

*Primary Examiner* — Thomas M Dougherty
(74) *Attorney, Agent, or Firm* — Patterson Thuente Christensen Pedersen, P.A.

(57) ABSTRACT

An angular rate sensor system [10] comprising a vibratory sensing element [12] and signal processing circuit [14]. The element [12] is preferably a polymorphic rectangular bar fabricated from two layers of piezoceramic material [26, 28] divided by a thin center electrode [$E_c$], and a plurality of electrodes [$E_1$-$E_4$] scored onto the planar conductive surfaces [30, 32]. The element [12] is suspended at its acoustic nodes [N, N'] to vibrate in one direction [V] normal to the physical plane of the electrodes [$E_c$, $E_1$-$E_4$] using any suitable mounting structure such as parallel crossed filaments [34] or inwardly angled support arms [64] that provide predetermined degrees of lateral [S'] and longitudinal [S] stiffness. The circuit [14] may optionally constitute totally shared [FIG. 7], partially shared [FIG. 8], or totally isolated [FIG. 9] driving and sensing functions, the corresponding element [12] being configured with dual-pair, single-pair, or single-triple outer electrodes [$E_1$-$E_4$], respectively. The circuit [14] typically utilizes an automatic gain control and two operational amplifiers, and may include various signal conditioning components and a separate tuning module.

86 Claims, 8 Drawing Sheets

U.S. PATENT DOCUMENTS 3,177,727 A * 4/1965 Douglas ..... 73/504.13
3,182,512 A * 5/1965 Jones et al. ..... 73/504.13
3,233,466 A * 2/1966 Shaw, Jr. ..... 73/514.29
3,241,377 A * 3/1966 Newton, Jr. ..... 74/5.6 R
3,258,617 A * 6/1966 Hart ..... 310/321
3,273,397 A * 9/1966 Forward ..... 73/382 R
3,474,268 A * 10/1969 Rudnick ..... 310/328
3,482,121 A * 12/1969 Hatschek ..... 310/329
3,504,554 A * 4/1970 Taylor ..... 73/504.14
3,515,003 A * 6/1970 Taylor ..... 73/504.14
3,520,193 A * 7/1970 Grangroth ..... 73/504.14
3,520,195 A * 7/1970 Tehon ..... 73/504.14
3,566,164 A 2/1971 Boillat et al.
3,590,287 A * 6/1971 Berlincourt et al. ..... 310/321
3,614,487 A * 10/1971 Hatschek ..... 310/329
3,636,387 A * 1/1972 Hatschek ..... 310/329
3,688,187 A * 8/1972 Loos ..... 324/224
3,750,300 A * 8/1973 Tumback ..... 33/324
3,763,446 A * 10/1973 Toyoshima et al. ..... 333/189
3,830,091 A * 8/1974 Sinsky ..... 73/1.38
3,842,681 A * 10/1974 Mumme ..... 73/504.15
3,913,195 A * 10/1975 Beaver ..... 29/25.35
3,938,256 A * 2/1976 Crocker, Jr. ..... 33/324
3,961,210 A * 6/1976 Nagata et al. ..... 310/320
3,987,555 A * 10/1976 Haagens et al. ..... 33/324
4,003,258 A * 1/1977 Suzuki ..... 73/290 R
4,049,223 A * 9/1977 Watson ..... 244/180
4,075,764 A * 2/1978 Krogmann et al. ..... 33/324
4,113,387 A * 9/1978 Shutt ..... 356/469
4,114,451 A * 9/1978 Crittenden et al. ..... 73/504.02
4,114,452 A * 9/1978 Bitson ..... 73/504.02
4,178,526 A * 12/1979 Nakamura et al. ..... 310/321
4,220,885 A * 9/1980 Yamashita et al. ..... 310/321
4,222,272 A * 9/1980 Mairson ..... 73/504.03
4,245,498 A * 1/1981 Poquette, Jr. ..... 73/152.54
4,302,694 A * 11/1981 Fujishima et al. ..... 310/321
4,321,678 A * 3/1982 Krogmann ..... 701/220
4,340,835 A * 7/1982 Nakamura et al. ..... 310/321
4,353,259 A * 10/1982 Schneider, Jr. ..... 73/653
4,360,754 A * 11/1982 Toyoshima et al. ..... 310/366
4,379,365 A * 4/1983 Riethmuller et al. ..... 33/316
4,396,878 A * 8/1983 Cole et al. ..... 318/648
4,431,150 A * 2/1984 Epperson, Jr. ..... 244/3.21
4,431,935 A * 2/1984 Rider ..... 310/331
4,442,723 A * 4/1984 Auer ..... 74/5.47
4,443,952 A * 4/1984 Schulien et al. ..... 33/324
4,444,053 A * 4/1984 Rider ..... 73/504.03
4,454,769 A * 6/1984 Loos ..... 73/862.041
4,457,173 A * 7/1984 Hunter ..... 73/510
4,461,089 A * 7/1984 Krogmann ..... 33/324
4,472,654 A * 9/1984 Nakamura et al. ..... 310/321
4,479,098 A * 10/1984 Watson ..... 331/154
4,489,609 A * 12/1984 Burdess et al. ..... 73/504.14
4,503,350 A 3/1985 Nakatani
4,511,821 A * 4/1985 Nakamura et al. ..... 310/354
4,511,848 A * 4/1985 Watson ..... 329/349
4,512,086 A * 4/1985 Galuschak et al. ..... 33/324
4,530,164 A * 7/1985 Barriac ..... 33/324
4,532,451 A * 7/1985 Inoue ..... 310/353
4,538,461 A * 9/1985 Juptner et al. ..... 73/504.16
4,564,782 A * 1/1986 Ogawa ..... 310/359
4,578,650 A * 3/1986 Watson ..... 331/160
4,586,377 A * 5/1986 Schmid ..... 73/514.34
4,590,801 A * 5/1986 Merhav ..... 73/510
4,593,160 A * 6/1986 Nakamura ..... 381/163
4,599,803 A * 7/1986 Galuschak et al. ..... 33/301
4,603,483 A * 8/1986 Wing ..... 33/324
4,605,876 A * 8/1986 Ogawa et al. ..... 310/358
4,609,883 A * 9/1986 Mizumura et al. ..... 331/96
4,622,646 A * 11/1986 Waller et al. ..... 702/93
4,626,809 A * 12/1986 Mizumura et al. ..... 333/202
4,628,734 A * 12/1986 Watson ..... 73/504.16
4,645,994 A * 2/1987 Giancola et al. ..... 318/649
4,649,313 A * 3/1987 Ogawa et al. ..... 310/358
4,652,784 A * 3/1987 Inoue et al. ..... 310/320
4,654,663 A * 3/1987 Alsenz et al. ..... 340/870.3
4,671,112 A * 6/1987 Kimura et al. ..... 73/504.16
4,674,331 A * 6/1987 Watson ..... 73/504.16
4,675,688 A * 6/1987 Sahara et al. ..... 343/765
4,686,771 A * 8/1987 Beveventano et al. ..... 33/324
4,736,168 A * 4/1988 Nagata ..... 331/96
4,739,661 A * 4/1988 Bucholtz et al. ..... 73/514.26
4,742,264 A * 5/1988 Ogawa ..... 310/332
4,757,289 A * 7/1988 Kosugi et al. ..... 333/209
4,761,743 A * 8/1988 Wittke ..... 702/41
4,779,020 A * 10/1988 Konno et al. ..... 310/325
4,780,062 A * 10/1988 Yamada et al. ..... 417/410.2
4,791,727 A * 12/1988 Hojo et al. ..... 33/325
4,791,815 A * 12/1988 Yamaguchi et al. ..... 73/504.16
4,802,364 A * 2/1989 Cage et al. ..... 73/504.15
4,811,233 A * 3/1989 Lauro ..... 701/220
4,821,006 A * 4/1989 Ishikawa et al. ..... 333/202
4,823,041 A * 4/1989 Inoue et al. ..... 310/322
4,849,724 A * 7/1989 Koreeda ..... 333/212
4,864,259 A * 9/1989 Takamoro et al. ..... 333/189
4,894,580 A * 1/1990 Ogawa ..... 310/320
4,914,406 A * 4/1990 Ohkubo ..... 331/116 R
4,918,350 A * 4/1990 Ando et al. ..... 310/320
4,979,398 A * 12/1990 Goodzey et al. ..... 73/862.326
4,984,463 A * 1/1991 Idogaki et al. ..... 73/514.08
4,990,918 A * 2/1991 Michelson et al. ..... 342/7
4,993,274 A * 2/1991 Downton ..... 74/5.46
5,003,258 A 3/1991 Mancini ..... 324/207.12
5,014,554 A * 5/1991 Terada et al. ..... 73/504.16
5,020,744 A * 6/1991 Schwarzschild ..... 244/164
5,038,613 A * 8/1991 Takenaka et al. ..... 73/510
5,043,661 A * 8/1991 Dubey ..... 324/207.12
5,052,226 A * 10/1991 Schmid ..... 73/514.34
5,054,320 A * 10/1991 Yvon ..... 73/514.18
5,055,801 A * 10/1991 Koga et al. ..... 331/14
5,070,737 A * 12/1991 Reilly ..... 73/862.046
5,074,152 A * 12/1991 Ellner et al. ..... 73/766
5,099,690 A * 3/1992 Califano ..... 73/510
5,170,089 A * 12/1992 Fulton ..... 310/328
5,216,315 A * 6/1993 Terada et al. ..... 310/329
5,254,898 A * 10/1993 Terajima ..... 310/321

FOREIGN PATENT DOCUMENTS

GB 2206415 * 1/1989
GB 2 223 309 A 4/1990
JP 59-51517 * 3/1984
JP 63-292017 11/1988
JP 63292017 11/1988
JP 2-223818 * 2/1990
JP 2128117 5/1990
JP 2-266215 * 10/1990
JP 2-266601 * 10/1990
JP 2298812 12/1990
JP 3-34613 2/1991
JP 3-150914 * 3/1991
JP 3-243814 * 10/1991
JP 3-13006 * 12/1991
JP 4-0006472 * 1/1992
JP 4-006472 1/1992 ..... 73/517 R
JP 4-020862 * 1/1992
JP 4-38513 3/1992
JP 4118515 4/1992
JP 5-34162 2/1993
JP 6222120 8/1994

OTHER PUBLICATIONS

"Theory and Error Analysis of Vibrating-Member Gyroscope"; Friedland, Bernard and Hutton; IEEE; vol. AC-23, No. 4 Aug. 1978.*
"Piezoelectric Vibratory Gyroscope Using Flexural Vibration of a Triangular Bar"; Fujishima, Satoru, Nakamura, Takeshi and Fujimoto; No Date Given.*
"Inertial Sensor Utilizes Coriolis Effect"; Klass; Aviation Week & Space Technology; Oct. 10, 1983; pp. 89-91.*
Toyama, Phase Characteristics of Vibratory Rate Gyro-Sensitivity of Measurement of Angular Velocity-, 1988, pp. 151-156.
Connelly, Analog Integrated Circuits, Devices, Circuits, Systems, and Applications, 1975, 7 pages.
Sumio Sugawara, Masashi Konno, Subaru Kudo, and Tomio Yoshida, *Equivalent Circuits of Vibratory Gyroscopes Using a Flecurally-Vibrating Resonator, T.IEE Japan,* vol. 111-C, No. 9, '91, pp. 445-461. Published in Japan.

Masatoshi Toyama and Chikashi Otani, *Phase Characteristics of Vibratory Rate Gyro Sensitivity of Measurement of Angular Velocity, JSPE*-54-12, '88-12-2365, pp. 151-156.
"Intertial Rate Sensor Technology." Watson Industries, Ind. p. 1-31.
"Office of Naval Research Department of the Navy: Piezoelectric Vibrating Beam Rate Gyro." By William S. Watson. vol. IV No. 6, Jun. 1979.
"Vibratory Gyroscope Using Piezoelectrically Driving Metal Bar". muRata.
Friedland, Bernard and Maurice F. Hutton. "Theory and Error Analysis of Vibrating-Member Gyroscope." *IEEE*: vol. AC-23, No. 4. Aug. 1978.
Fujishima, Satoru; Nakamura, Takeshi; and Katsumi Fujimoto. "Piezoelectric Vibratory Gyroscope Using Flexural Vibration of A Triangular Bar."
Klass, Philip J. "Inertial Sensor Utilizes Coriolis Effect." *Aviation Week & Space Technology.* Oct. 10, 1983: 89-91.

* cited by examiner

SINGLE BAR TYPE VIBRATING ELEMENT ANGULAR RATE SENSOR SYSTEM

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates generally to angular rate sensors of the vibrating element type, and particularly to an angular rate tensor having a tingle integrated driving and sensing element.

2. Description of the Prior Art

U.S. Pat. No. 2,513,340 to Lyman discloses the use of flexure-sensitive Rochelle salt crystals as strain tensing elements connected to an axially rotating tuning-fork whose oscillations are magnetically induced. The Lyman '340 device measures rate of turn or change in orientation of a body to which the tuning-fork it attached, and represents an early example of the use of strain-sensitive piezoelectric type crystals in an angular gyroscope or rate sensing application.

Various types of angular rate tensors employing piezoelectric crystal elements (or transducers) that are electrically excited to induce vibration are known to the art.

The use of vibrating piezoelectric crystal elements in gyroscopes and angular rate tensing devices can be traced back at least to U.S. Pat. No. 2,716,893 to Birdsall, which discloses paired transducers mounted in diametric opposition on a rotor to provide two-axis angular rate or acceleration measurement with directional specificity obtained by phase difference calculations. The Birdsall '893 device provided the means for constructing mass-independent navigation and guidance gyroscopes, but did not result in practical systems for applications such as fixed-position north-seeking gyroscopes or navigational altitude and heading referencing until the development of suitable control and filtering circuits. Representative examples of operational embodiments for those applications are shown in U.S. Pat. Nos. 3,987,555 to Haagens and 4,444,053 to Rider.

In particular, angular rate sensors having dual drive and sensing elements disposed in a "tuning-fork" configuration are the primary subject of current development activity. Some vibrating element angular rate sensors of this type, and representative drive circuits and applications for those sensors, are disclosed in U.S. Pat. Nos. 4,479,098; 4,578,650; and 4,628,734 to Watson; U.S. Pat. No. 4,671,112 to Kimura; U.S. Pat. No. 5,038,613 to Takenaka; U.S. Pat. No. 5,014,554 to Terada, and U.S. Pat. No. 4,791,815 to Yamaguchi.

These vibrating element angular rate sensors are usually characterized by a pair of parallel drive elements attached to an intermediate bridge member, with a sensing element attached to the distal end of each drive element and oriented orthogonal to that corresponding drive element. One or both of the drive elements are electrically excited to induce flexure therein in order to energize the sensing elements, and cause them to vibrate back and forth in opposition to one another within an inertial plane at a resonant frequency.

Tuning-fork type sensors can be very labor intensive to fabricate due to the bonded and insulated joints that must be formed between the bridge member, drive elements, and sensing elements, and the need to properly orient the drive and sensing elements relative to one another. The joints and the construction of the bridge member can also lead to abnormalities and imperfections that will affect the accuracy of the angular rate sensor if not filtered or corrected electronically. These devices are also subject to damage from handling during fabrication and the high G-forces imparted on the elements due to shocks or rapid acceleration and deceleration.

Other types of angular rate sensors utilizing vibrating transducers are also known to the art. One representative example is the "cantilever" type configuration shown in U.S. Pat. No. 3,842,681 to Mumme, in which six paired transducers extend radially from a hub having a central axis of rotation. Two drive transducers are oriented with their planar faces parallel to the axis of rotation and normal to their angular velocity vector, and impart vibratory oscillations to the two remaining pairs of sensing transducers. The two pairs of sensing transducers are oriented orthogonal to one another, with their planar faces parallel to their angular velocity vectors and perpendicular to the axis of rotation.

However, the Mumme '681 device requires a very complicated suspension system that does not operate effectively, and the long warm-up time of several minutes necessary to establish predominance of the primary torsional oscillations over the lateral deflection vibrations has prevented development of a production model for angular rate sensing applications.

Composite rate sensing systems incorporating single or paired vibrating tuning-forks and vibrating cantilever structures with constrained seismic masses are also know. Representative examples of such systems are shown in U.S. Pat. Nos. 2,544,646 to Barnaby and 4,802,364 to Cage, as well as Great Britain Patent Specification No. 1,540,279 to Philpotts.

Various "vibrating beam" angular rate sensors utilizing a plurality of vibrating transducers mounted on a rigid elastic core are also known to the art. These angular rate sensors provide separate transducers for driving and sensing, with the structural and physical properties of the core defining the flexural characteristics of the angular rate sensor and the vibrational modes of the transducers.

One representative example is shown in U.S. Pat. No. 3,520,195 to Tehon, which discloses an angular velocity sensing device having a central core or body with a square cross section, and a plurality of transducers bonded or soldered to each of its longitudinal surfaces. Each transducer has a pair of spaced-apart silver electrodes bonded or soldered to the outer surface opposing the central body through which the transducer can be electrically excited, or which will develop a voltage in response to flexure of the transducer induced by rotation of the central body about its longitudinal axis. A first pair of opposing transducers are energized to vibrate the central body at a resonant frequency, while the second pair of opposing transducers act as the sensing or read-out elements. Tehon '195 particularly discloses a hard or invariable metal rod such as stainless steel for the central body, and suggests that a central body having a circular or polyhedral cross section would also be operable.

Tehon '195 discloses a mounting structure in which the ends of the central body are clamped one resonant wavelength apart (defining an acoustic node located at the midpoint of the central body), and an alternate mounting structure in which the central body is directly supported at the natural acoustic nodes (one half resonant wavelength apart and inward from each end approximately 0.224-0.226 times the length of the central body) to eliminate the reflected acoustic energy created by clamping both ends. The Vyro ® inertial angular rate sensor produced by General Electric constituted a practical implementation of the nodal point mounting of the Tehon '195 device. Vibrating beam systems are typically used for measuring rotational accelerations and velocities, with a representative circuit for the dynamic system analysis of such a vibrating beam accelerometer being shown in U.S. Pat. No. 4,761,743 to Wittke.

Vibrating beam sensors of this type are subject to certain drawbacks. Since the core is a rigid elastic body, it is subject to mechanical fatigue and structural unreliability. The significant amount of tuning required by the system must be accomplished through electronic compensation. Since the same resonant driving and sensing frequencies are used to increase sensitivity, the system is very susceptible to bias error and scale factor shift caused by temperature changes. Thermal expansion of the beam will also cause the nodal points and resonant frequency of the system to shift physically. Attaching the transducers to a uniform shape beam will itself shift the location of the nodal points and affect the resonant frequency, thus requiring experimental evaluation or complex theoretical analysis to determine the true nodal points and resonant frequency to correct for discrepancies and variations as the angular rate sensor expands or contracts. Imperfections in the beam can cause twisting which will produce erroneous sensing signals. The amplitude of the output voltage from the sensing element is itself so minute that extremely high amplification is required, thereby increasing noise and temperature-related bias. Bondhig the transducers to the beam can result in misalignment and structural imperfections which interfere with performance, and the bonds tend to fatigue and deteriorate at different rates along the length of each transducer or relative to other transducers on the same beam, thereby interfering with the proper transmission of drive energy from the drive elements to the beam or the complete and uniform flexure of the sensing elements. The transducers are small relative to the physical size of the core, and the drive activation area for the system is therefore correspondingly limited. Additionally, the physical presence of the vibrating core makes the system susceptible to external magnetic fields which induce eddy currents that cause core vibrations in the sensitive direction.

Recent variants of the vibrating beam type angular rate sensor utilize metal cores having uniform triangular, square, or hexagonal cross sections, or a non-uniform quadrangular prismatic cross section. In practical embodiments using a core having a triangular cross section, a pair of transducers for driving and sensing are mounted on two adjacent longitudinal surfaces with a single drive detecting transducer mounted on the remaining longitudinal surface. The core is suspended near its nodal points from inverted U-shaped metal supports. Each longitudinal edge or ridgeline of the triangular core can be trimmed to raise the resonant frequency in one direction, and the drive and sensing frequencies can therefore be matched so that resonant frequencies in the X- and Y-directions are equal. Trimming all the ridgelines results in a core having a non-uniform hexagonal cross section. Systems of this general type are discussed in Japanese Patent Application Nos. 3-150,914; 2-223,818; 2-266,215; 2-266,601; 3-13,006; 3-34,613; and 59-51,517; and have been implemented in the Gyrostar ™ angular rate sensor by Mura Tech Manufacturing Company.

Such systems have many of the structural drawbacks found in the Tehon '195 device since the piezoelectric crystals are still bonded to a rigid elastic core in the same manner as Tehon '195. While the ability to trim the ridgelines of the core can facilitate some mechanical tuning that is otherwise accomplished through electronic compensation, this mechanical tuning must be accomplished manually for each sensor produced. These sensor systems typically have a high Q-value and narrow operational bandwidth, making them unsuitable for many applications. Matching the driving and sensing frequencies does increase the sensitivity of the system by its Q-value, but also increases the sensitivity to temperature change and particularly to resonant or on-frequency vibrations. While one could compensate for having a lower Q-value by driving the system harder, there are practical limits posed by the capabilities of the drive circuit electronics and the fatigue properties of the bar. In addition, these sensors vibrate freely in the longitudinal direction parallel with the major axis of the core.

The concept of mounting a vibrating transducer on a rigid elastic core has also been extended to cores having a tuning-fork shape for use in devices such as acoustic resonators. Representative examples of such structures are shown in U.S. Pat. Nos. 4,178,526 and 4,472,654 to Nakamura.

U.S. Pat. Nos. 3,258,617 to Hart and 4,489,609 to Burdess each disclose a gyroscopic or inertial rotation measuring device having a matrix of electrodes adhered or disposed on the outer surfaces and extending around the edges of a piezoelectric beam, and operating in the shear mode with forced double resonance. Hart '617 further discloses a layered construction with a pair of electrodes extending partially into the interior of the beam from opposing sides. The particular locations and shapes of the electrodes in the matrix are complex and difficult to construct. In Hart '617, the piezoelectric device is mounted within an aperture in a collar disposed at the center of the beam to produce a center nodal point and forced vibrations or oscillations of equal magnitude on the opposing sides of the collar and ends of the beam. In Burdess '609, the piezoelectric device is fixedly mounted at opposing ends to produce two end nodal points and a center nodal point, with the forced vibrations or oscillations on each side of the center nodal point being equal in amplitude but opposite in direction. Each of these devices is subject to the drawbacks discussed above relating to the beam-type devices such as Tehon '195, and a configuration such as the Burdess '609 device is particularly susceptible to torsional vibration and noise.

Accelerometers and angular rate sensing devices employing piezoelectric crystals having either a unitary tall toroidal structure or composed of stacked disks for vibrating a seismic mass are also known. Representative examples of such devices are shown in U.S. Pat. Nos. 5,052,226 and 4,586,377 to Schmid, and U.S. Pat. Nos. 3,636,387; 3,614,487; and 3,482,121 to Hatschek.

Several types of systems for angular rate or acceleration sensing that utilize vibrating bodies energized by means other than piezoelectric crystal elements are also known to the art.

One type is the vibrating wire rate sensor, in which a thin metal wire suspended from fixed ends is vibrated at its primary resonant frequency in one plane using; a drive magnet which surrounds a portion of the wire. A signal magnet is oriented to detect vibrations in the plane perpendicular to the drive plane which are induced by Coriolis forces caused by rotation of the wire. The amplitude of those vibrations will be proportional to the rate of rotation, and the phase shift of the vibrations will indicate the direction of rotation. Representative examples of vibrating wire angular rate sensors are shown in U.S. Pat. No. 3,520,193 to Granroth and U.S. Pat. Nos. 3,515,003 and 3,504,554 to Taylor.

Because the vibrating wire is fixed at both ends, the system produces a significant amount of reflected acoustic energy, as well as transferring significant mechanical energy through the supports to the surrounding structure. At least a portion of this energy can be reflected back to the sensor in the perpendicular plane, and create an erroneous sensing signal. While the erroneous signal will cause a relatively constant bias error in a fixed acoustic environment, temperature fluctuations and acceleration of the system will induce changes in the environment and the bias error can become very unpredictable. Complex mounting systems can reduce but not eliminate these signal errors. Also, the vibrating wire system does not provide a natural nodal support when used for rate sensing, so random external vibrations can create significant noise affecting the integrity of the output signal.

Another type of system employs magnetostrictive forces to induce flexure in an isotropic elastic body, with the Villari effect producing an output signal detectable by sensing magnets or electromotive devices. U.S. Pat. Nos. 2,455,939 to Meredith; 2817,779 to Barnaby; 2,974,530 to Jaouen; 3,177,727 to Douglas; 3,127,775 to Hansen; and 3,182,512 to Jones disclose a wide variety of angular velocity measuring devices in which resonant vibrations are induced in a magnetostrictive bodies (including bars, rods, tubes, hollow cylinders, and tuning-forks) by placing the bodies in a permanent or constant magnetic field, and then applying an alternating current to excite the bodies (or magnetically responsive elements attached to the bodies.) Flexure or vibration of the bodies within the magnetic field combined with movement of the bodies out of their inertial or vibratory plane produces variations in the magnetic flux lines within opposing parts of the body that are proportional to the angular velocity of the system. Jaouen '530 discloses several embodiments, including cylindrical rods having fixed ends mounted within a base, a tuning-fork structure, and a single cylindrical rod suspended at its nodal points. In this latter embodiment, the rod is either suspended by crossed wires passing through perpendicularly bored holes at the nodal points, or by spring steel needles welded at the nodal points, to permit two degrees of freedom perpendicular to the longitudinal axis.

Due to their cumbersome physical structures and the limitations imposed by their drive or sense signal processing circuitry, the vibrating wire and magnetostrictive systems described above are generally disfavored for modern rate sensing applications as compared to vibrating piezoceramic crystal element systems.

SUMMARY OF THE INVENTION

It is therefore one object of this invention to design an angular rate sensor and associated signal processing circuitry employing a vibrating piezoceramic element having a basic geometric shape (such as a rectangular bar) and substantially uniform construction which is suspended at its natural acoustic nodal points and mounted to achieve a predetermined level of vibrational "stiffness" in each of the planes orthogonal to the mode of driven vibration.

It is a related object of this invention to design the above angular rate sensor so that it utilizes a solid unitary piezoelectric device that does not require mechanical tuning, provides a lower intrinsic Q-value, increases rate sensing sensitivity compared with conventional angular rate sensors of the tuning-fork or vibrating beam types, is relatively insensitive to frequency changes, affords greater available bandwidth, and has negligible susceptibility to external magnetic fields.

It is further an object of this invention to design the above angular rate sensor to facilitate using independent drive and sensing frequencies, thus permitting a drive frequency high enough to substantially eliminate systemic noise (with the vibrational envelope rolling off at approximately one half the drive frequency), and so that baseline signals may be adjusted out.

It is yet another object of this invention to design the above angular rate sensor such that the effective length of the sensing element could be doubled without exceeding the physical parameters of a corresponding tuning-fork type sensor, thereby providing a fifth power (or three thousand percent) increase in sensitivity, along with substantial increases in drive activation area and stability compared with vibrating beam systems.

It is a further object of this invention to design the above angular rate sensor so that it may be fabricated using relatively inexpensive-and readily available materials and components, is constructed in a manner that reduces the potential for misalignment and other physical defects to occur during manufacturing, and will mitigate against structural fatigue and deterioration in operation due to a unitary structure.

It is a distinct object of this invention to design a particular embodiment of the above angular rate sensor in which the signal processing circuit provides for partially shared driving and sensing functions to thereby reduce system noise, eliminate the need to compensate for capacitance of the piezoelectric device, and reduce the number of electrical connections and manufacturing steps needed.

It is a unique object of this invention to design a further embodiment of the above angular rate sensor in which the signal processing circuit provides for totally isolated driving and sensing functions to further reduce system noise, and accomplish fully independent drive sensing and rate sensing.

Briefly described, the angular rate sensing system of this invention comprises a vibratory sensing element and a signal processing circuit which serves both driving and angular rate discriminating functions. The vibratory sensing element is preferably a single rectangular bar fabricated from two layers of piezoceramic material divided by a center electrode, with one or more outer electrodes scored onto one planar conductive face of the vibratory sensing element parallel with the center electrode, and a plurality of outer electrodes scored onto the opposing planar conductive face. The vibratory sensing element is polarized to a p-morph configuration, and vibrates in one dimension oriented normal to the physical plane of the electrodes.

The vibratory sensing element is preferably suspended at its natural acoustic nodes to vibrate freely without reflected energy, using any suitable mounting structure such as two parallel crossed filaments spaced one half wavelength apart, or four inwardly angled support arms that provide predetermined and potentially differing degrees of lateral and longitudinal stiffness. This latter mounting assembly permits flexure for thermal expansion and torsional freedom proximate to the vibratory sensing element.

Various embodiments of the driving and sensing signal processing circuit incorporate an automatic gain control, first and second operational amplifiers each with negative feedback loops, and signal conditioning components including a phase shifting means, demodulator, and low pass filter. The signal processing circuit may constitute totally shared, partially shared, or totally isolated driving and sensing functions, with the corresponding vibratory sensing element having a dual-pair, single-pair, or single-triple outer electrode configuration, respectively. A separate tuning module may also be utilized with a principal embodiment of the signal processing circuit.

DESCRIPTION OF THE PREFERRED EMBODIMENTS

The angular rate sensor system of this invention is shown in FIGS. 1-11 and referenced generally therein by the numeral 10. The various embodiments of the angular rate sensor system 10 discussed herein each comprise a solid or unitary piezoelectric or piezoceramic transducer or vibratory sensing element 12, and one or more electronic circuits 14 including a sensing output signal processing circuit function and shared, partially shared, or fully independent drive signal generating and drive sensing functions.

Structure of the Vibratory Sensing Element

Figure 1:
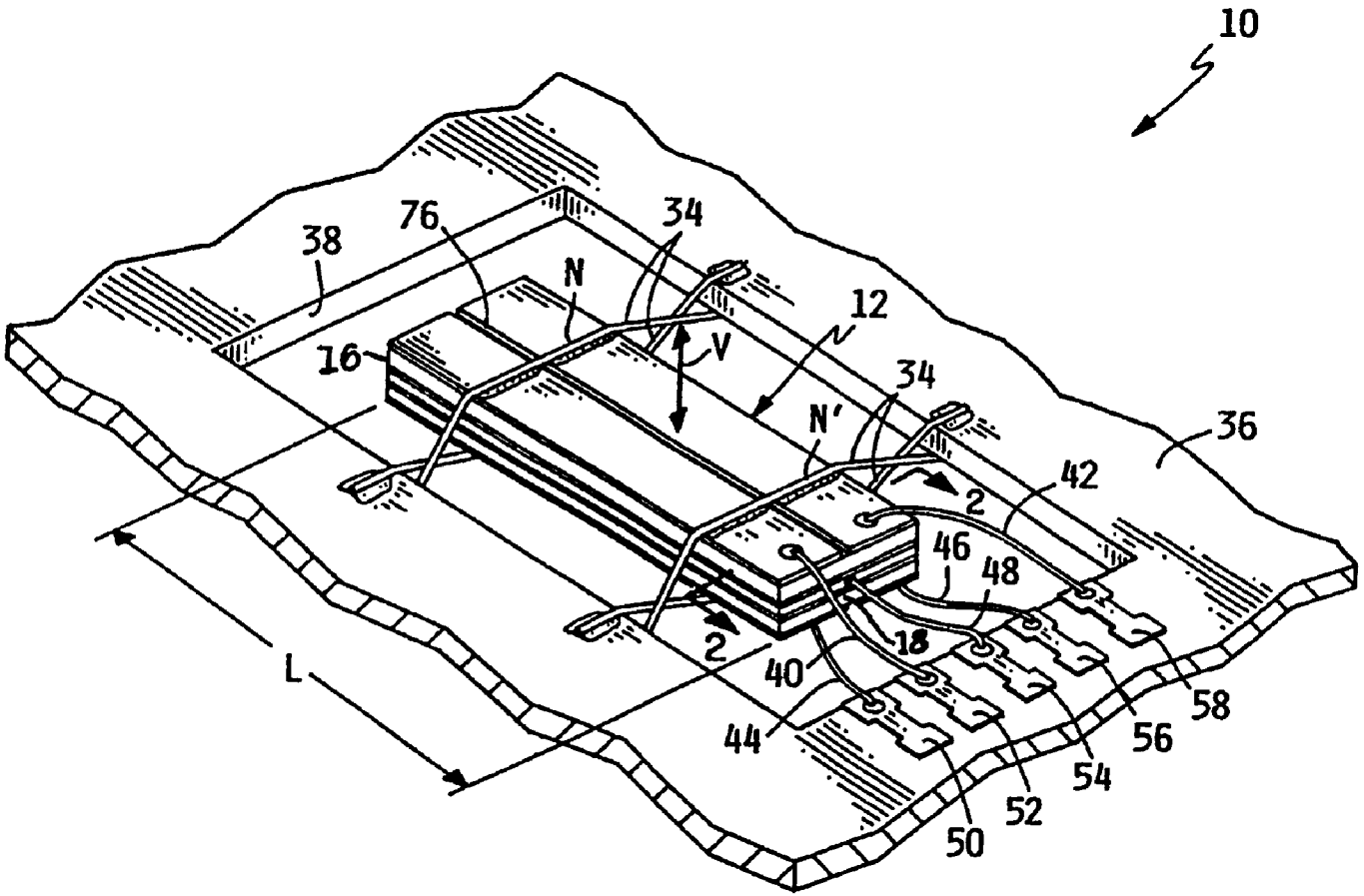
FIG. 1 is a perspective view of the dual-pair electrode embodiment of the vibratory sensing element of this invention mounted using a pair of crossed filaments disposed along the natural acoustic nodes of the vibratory sensing element.
Figure 2:
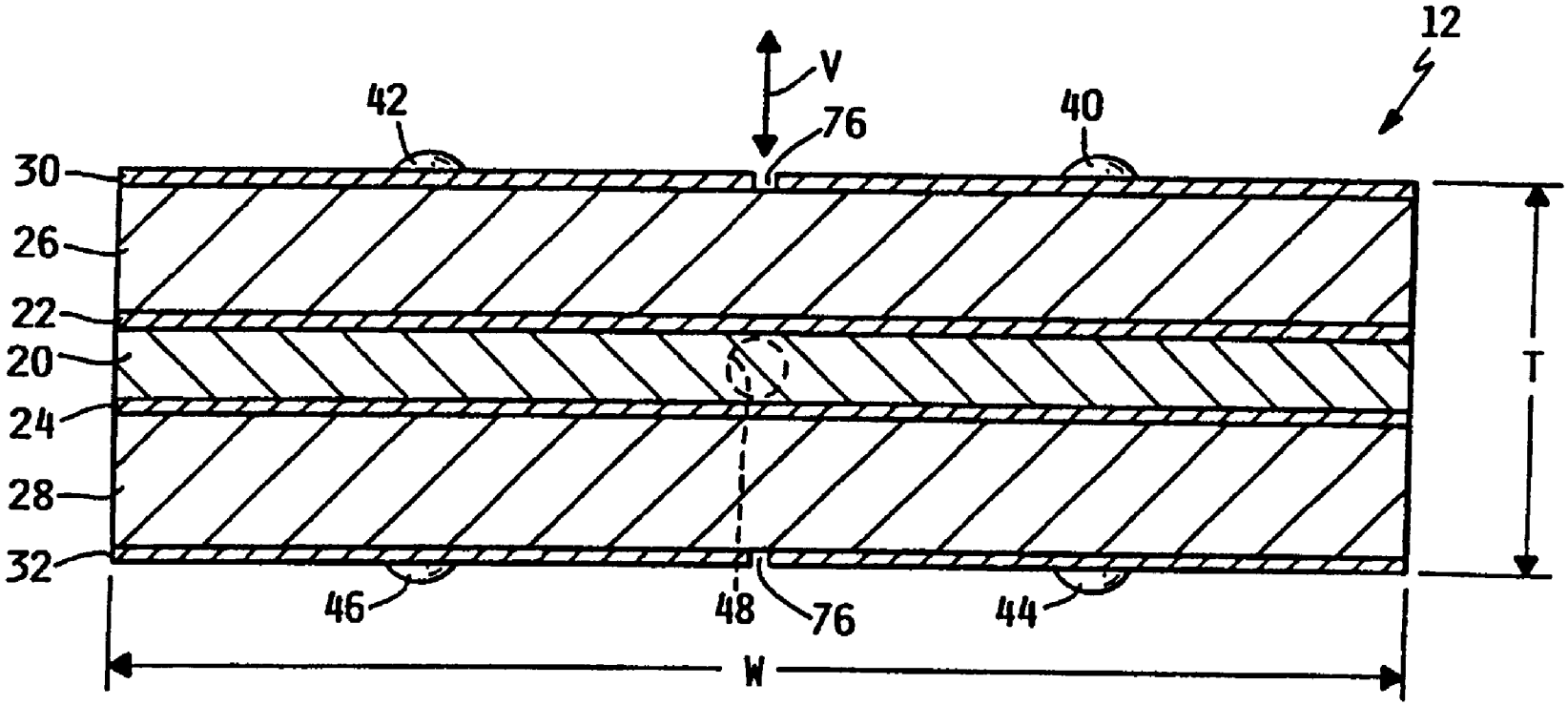
FIG. 2 is a cross section view of the dual-pair electrode embodiment of the vibratory sensing element of FIG. 1 taken through line 2-2 in FIG. 1.

In each of the embodiments discussed herein, the vibratory sensing element 12 comprises a generally uniform rectangular prismatic bar having a length L measured along the longitudinal axis, width W measured along the transverse or lateral axis, and thickness T measured in the direction or mode of vibration V as shown in FIGS. 1 and 2. One representative example of the physical dimensions of the vibratory sensing element 12 are a thickness T of 0.04", width W of 0.12", and length L of 1.18".

As has been shown in the art, for a uniform rectangular bar vibrated in the vibrational direction V perpendicular to its thickness T, the two natural acoustic nodal points for such a uniform rectangular bar will lie along lines N, N' extending perpendicular to the longitudinal axis (or within planes perpendicular to the longitudinal axis bisecting the vibratory sensing element 12 at the midpoint along the thickness T thereof) measured inward from each opposing end 16, 18 a distance of 0.2247 times the length L of the vibratory sensing element 12 (or L/(2+60½)).

Referring to FIG. 2, it may be seen that the vibratory sensing element 12 consists of a center or base electrode 20 fabricated from brass, Kovar ® alloyed metal as manufactured by Carpenter Technology Corporation of Reading, Pa., or another suitable conductive material, a pair of inner conductive layers 22, 24 each fabricated from a thin layer of silver or a suitable conductive material attached to the two opposing exterior surfaces of the base electrode 20, a pair of piezoelectric layers 26, 28 each fabricated from a piezoceramic crystal attached to the two opposing exterior surfaces of the inner conductive layers 22, 24, and a pair of outer conductive layers 30, 32 each fabricated from a thin layer of silver or a suitable conductive material attached to the two opposing exterior surfaces of the pair of piezoelectric layers 26, 28. The layers 20-32 of the vibratory sensing element 12 are connected or attached to one another as described above in any conventional manner utilized in the fabrication of piezoelectric or piezoceramic crystal sheets, with the conductive layers 22, 24 30, 32 being fired on to the piezoelectric layers 26, 28 using a metallic ink as in ordinary ceramic manufacturing processes, with the resulting sheets being cut or dissected to form vibratory sensing elements 12. This results in the piezoelectric crystal elements of the a vibratory sensing element 12 having a Q-value on the order of 40 (or 1/50th the Q-value for the triangular cross section vibrating beam sensor discussed above) representing a nominal change of approximately 16 db in normal operation.

One or both of the outer conductive layers 30, 32 of each vibratory sensing element 12 is scored or etched to form a plurality of electrodes $E_1$-$E_4$ as discussed in further detail below. This scoring or etching may be accomplished by any conventional means, such as manual scoring using a diamond-tipped scribe or cutting wheel, to create a linear score line 76 extending entirely through the conductive layers 30, 32 and forming a gap, groove, or channel having a width of approximately 0.005" between the adjacent electrodes $E_1$-$E_4$. The vibratory sensing element 12 further defines four edgewise faces other than the outer conductive layers 30, 32 disposed around the perimeter surface of the vibratory sensing element 12 along its thickness T and parallel with the vibrational direction V, each of those four edgewise faces of the perimeter surface being generally free of electrodes adhered thereto or defined thereby, with the exception of the exposed portions of the center or base electrode 20 which extends outwardly toward and adjacent to each of the four edgewise faces of the perimeter surface.

Figure 5:
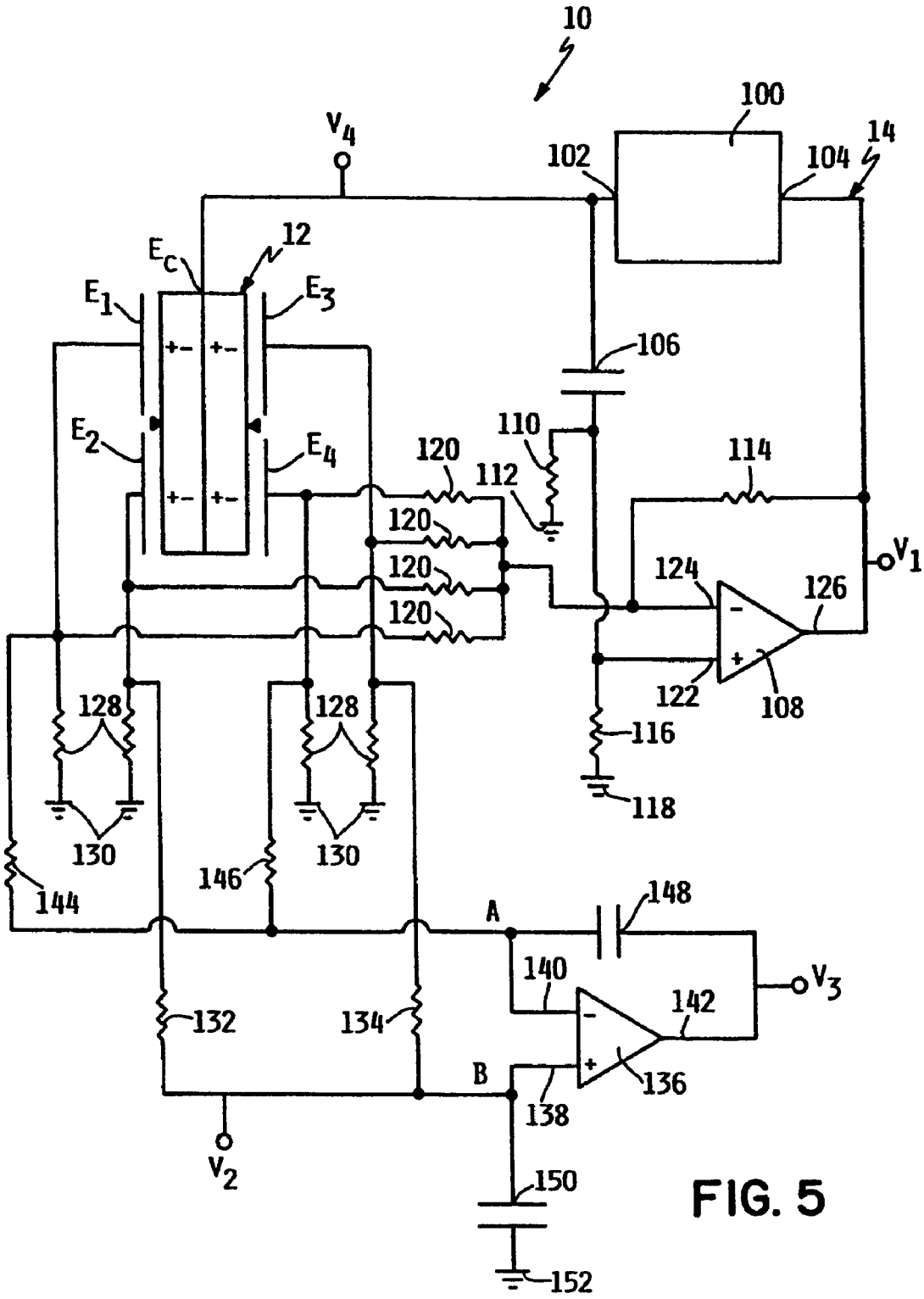
FIG. 5 is a schematic diagram of the principal drive and sensing signal processing circuit for the angular rate sensing system of this invention.
Figure 7:
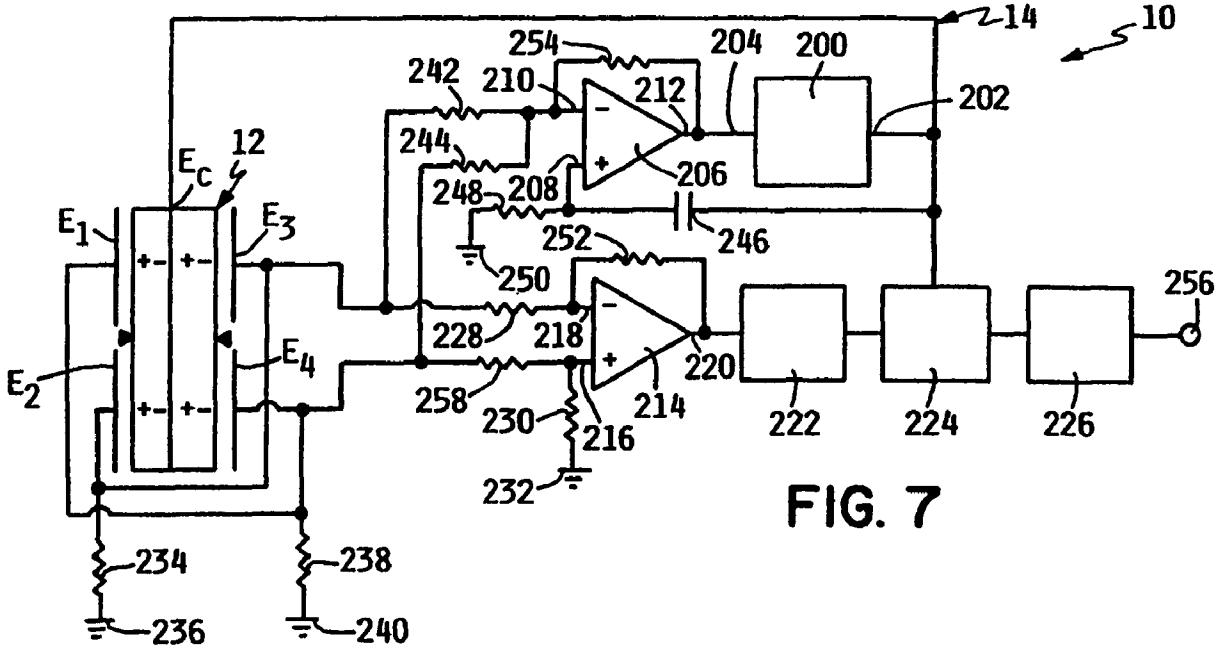
FIG. 7 is a schematic diagram of a totally shared drive and sensing embodiment of the signal processing circuit for use with the dual-pair electrode embodiment of the vibratory sensing element.

The vibratory sensing element 12 is preferably convened to a poly- or p-morph for proper functioning as an angular rate sensing device by grounding the base electrode 20 and electrically stimulating the outer conductive layers 30, 32 at approximately 800 Vdc while the vibratory sensing element 12 is immersed in an oil bath, thereby repolarizing the layers of vibratory sensing [dement] *element* 12 as shown by the positive and negative charge signs in FIGS. 5 and 7.

Mounting

Referring particularly to FIG. 1, a first embodiment for mounting the vibratory sensing element 12 of the angular rate sensor 10 is shown. In this first embodiment, the vibratory sensing element 12 is suspended at its nodal points along fines N, N' by a pair of thin filaments 34 which may be fiberglass, fabric, or coated or nonconductive metal threads. The filaments 34 are disposed on opposing faces of and receive the vibratory sensing element 12 therebetween, the filaments 34 contacting and traversing the surfaces of the outer conductive layers 30, 32 along and parallel with the pair of lines N, N' defining the acoustic nodes. The filaments 34 are adhered or otherwise connected to the outer conductive layers 30, 32 along the pair of lines N, N' as shown in FIG. 1. One or both of the opposing ends of the filaments 34 are crossed over one another to engage and hold the vibratory sensing element 12 on each side of the vibratory sensing element 12, the crossed filaments 34 forming a flexure point at the juncture of the filaments 34. The opposing ends of the filaments 34 are attached to or fixedly mounted on a generally planar frame member 36 such as a circuit board with the crossed portions or flexure points of the filaments 34 being generally coplanar with the frame member 36 and positioned proximate to the midpoint of the thickness T of the vibratory sensing element 12 and between the vibratory sensing element 12 and frame member 36. The filaments 34 may be looped through apertures in the frame member 36, soldered or adhered to the frame member 36 as shown in FIG. 1, or connected to the frame member 36 using an adjustable or tensionable connection such as a peg or turnbuckle. The frame member 36 defines an opening 38 such as an uniform rectangular aperture within which the vibratory sensing element 12 is disposed, with the perimeter edges of the vibratory sensing element 12 being spaced apart approximately equal distances from each of the peripheral edges of the opening 38 and oriented generally parallel therewith. It has been found that filaments 34 comprised of thin fiberglass threads provide an higher Q-value, as well as higher tensile strength and therefore less incidental vibration in the direction V of the mode of vibration at the nodal points (N, N'), as compared with fabric or metal filaments 34, and are therefore preferred. Resilient pads (not shown) may need to be placed between the edges of the vibratory sensing element 12 and the filaments 34, or the edges rounded or beveled in the area adjacent where the filaments 34 pass or bend over the edges, to prevent laceration of or damage to the filaments 34.

A plurality of electrically conductive leads 40-48 are attached to the vibratory sensing element 12 in the manner described below, with each of the leads 40-48 in turn being electrically connected to one of a plurality of terminals 50-58 defined by the frame member 36 or integrated into and electrically connected to one or more of the electronic circuits 14.

Figure 3:
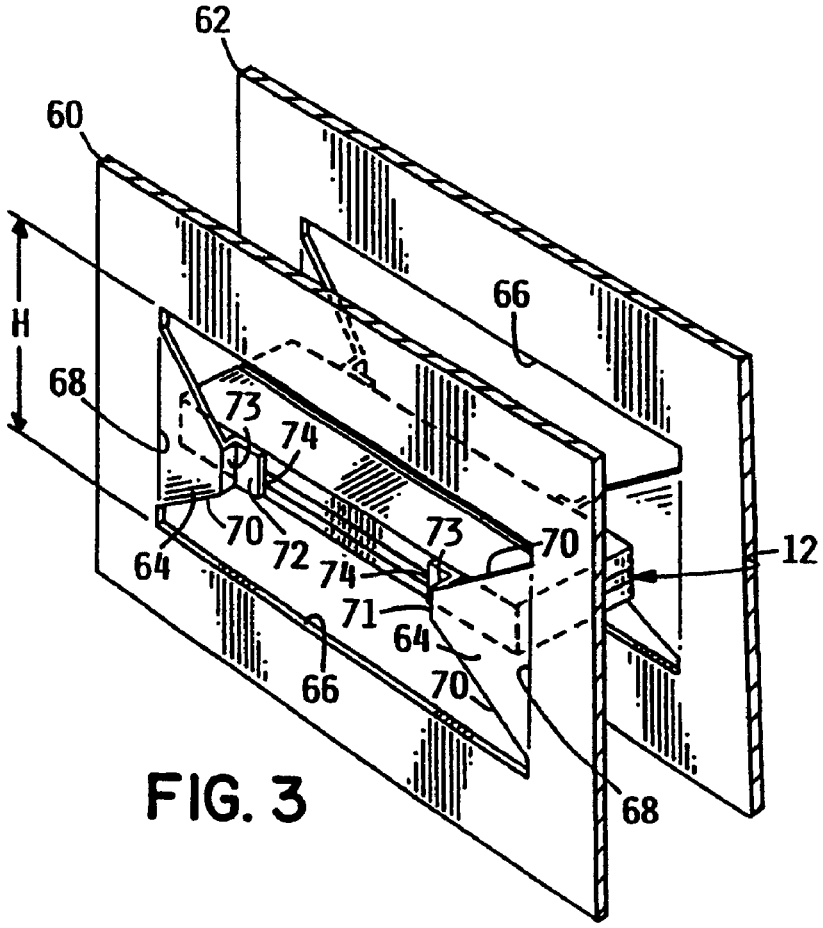
FIG. 3 is a perspective view of the vibratory sensing element mounted using a pair of parallel plate members having inwardly angled support arms attached proximate to the natural acoustic nodes of the vibratory sensing element.
Figure 4:
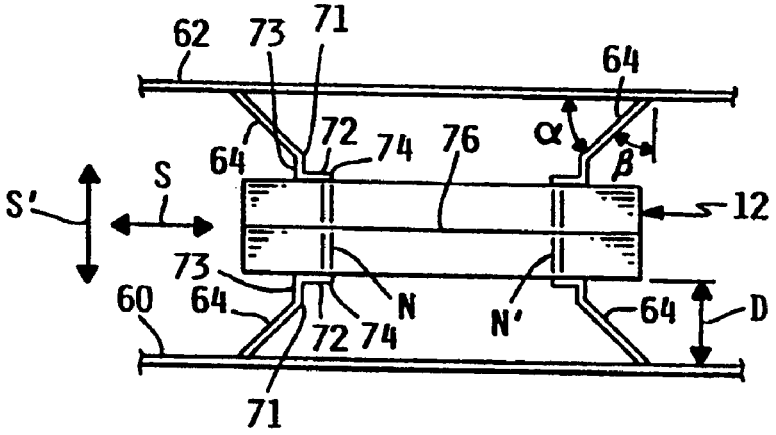
FIG. 4 is a top view of the perspective view of the vibratory sensing element, parallel plate members, and inwardly angled support arms of FIG. 3.

Referring particularly to FIGS. 3 and 4, a second embodiment for mounting the vibratory sensing element 12 of the angular rate sensor system 10 is shown. In this second embodiment, the vibratory sensing element 12 is suspended at its nodal points between a pair of parallel mounting plate members 60, 62, each of which define a pair of thin support arms 64 which extend inwardly toward one another. The support arms 64 are formed integrally with the plate members 60, 62 by stamping a generally rectangular opening 66 entirely through the plate members 60, 62, with the shape of the opening 66 defining the support arms 64. The support arms 64 extend inwardly into the opening 66 from the surrounding plate members 60, 62 from the opposing end edges 68 of the opening 66 between which the length of the opening 66 is measured. Each support arm 64 has a proximal end disposed adjacent to and along the corresponding end edge 68, a body section defined by a pair of inclined or tapered edges 70 extending toward one another from the corresponding proximal end and terminating at line 71 generally parallel with the end edge 68 of the opening 66, a generally rectangular intermediate section 73 extending from the line 71 and oriented generally perpendicular to the corresponding plate member 60, 62, and a generally rectangular tip or distal end 74 connected to and extending from the intermediate section 73 along line 72 and generally parallel with the corresponding plate member 60, 62 and side edge of the vibratory sensing [dement] *element* 12. Along each end edge 68, the opening 66 has a height H which may be generally equal to or greater than the height of the support arm 64 directly adjacent to that end edge 68. The distal end 74 of each support arm 64 has a height approximately equal to of slightly less than the thickness T of the vibratory sensing element 12.

Referring to FIG. 4, it may be seen that each plate member 60, 62 is spaced apart a distance D from the corresponding side of the vibratory sensing element 12, the plate members 60, 62 being parallel with one another and the sides of the vibratory sensing element 12. Each support arm 64 is bent or angled inwardly toward the vibratory sensing element 12 across a fold line formed at the end edge 68 at an angle $\alpha$ relative to the coplanar surrounding portions of plate members 60, 62, with the complement angle $\beta$ of the support arms 64 being formed relative to perpendicular with the plate members 60, 62 and parallel with the ends of the vibratory sensing element 12. The distal end 74 of each support arm 64 is bent or angled across fold line 72 at an angle $\beta$ relative to the body of the support arm 64 such that distal end 74 is parallel with and directly adjacent to the corresponding side of the vibratory sensing element 12. The intermediate segment 73 and bend at line 71 provide flexure for thermal expansion and relieve torque stress.

The vibratory sensing element 12 is then mounted or suspended by adhering, bonding, or attaching each support arm 64 to the one of the two opposing edgewise faces of the vibratory sensing element 12 such that the fold lines 72 or a portion of the distal ends 74 of the support arms 64 are aligned with and along the lines N, N' representing the nodal points of the vibratory sensing element 12 so as to maximize or optimize the ability of the vibratory sensing element 12 to freely vibrate in the direction or mode of vibration V at its resonant frequence.

Adjusting factors such as the composition, thickness, flexibility, and rigidity of the materials used to fabricate the plate members 60, 62, the length of the support arms 64, and the relative angles $\alpha$, $\beta$ formed between the support arms 64 and the plate members 60, 62 or vibratory sensing element 12 will affect the "stiffness" or resistance to linear vibration of the vibratory sensing element 12 in either the longitudinal S or lateral S' directions normal to the mode of vibration V. It may be appreciated that adjusting or varying the relative angles $\alpha$, $\beta$ formed between the support arms 64 and the plate members 60, 62 or vibratory sensing element 12 (absent other compensating modifications) will have an opposite effect on the stiffness of the mounting assembly in the longitudinal S and lateral S' directions, with an increase in the lateral S' stiffness resulting in a decrease in longitudinal S stiffness, and vice versa. The magnitude of the effect of these angular adjustments will normally be proportional to the sine or cosine of the relevant angle $\alpha$, $\beta$, such that the longitudinal S and lateral S' stiffness of the mounting assembly may be optimized for particular applications. Relative angles $\alpha$, $\beta$ between the support arms 64 and the plate members 60, 62 of 45° have proven suitable for the embodiments of the angular rate sensing system discussed herein. In addition, the thickness and pliability of the metal or material from which the support arms 64 are fabricated will affect the longitudinal S and lateral S' stiffness of the mounting assembly, and a balance can effectively be drawn to optimize or weigh off the maximum g-forces to which the angular rate sensor system 10 will be subjected against the maximum desirable "softness" of the overall mounting assembly, thus permitting the mounting assembly to be adequately soft so there is no input from vibrations in the sensing range but the support arms 64 will not shear, crack, or flex unduly during rapid acceleration or deceleration.

The plate members 60, 62 are fixedly or securely mounted in a frame or housing (not shown) suitable to protect the plate members 60, 62, support arms 64, vibratory sensing element 12, and the associated leads 40-48 and electrical components from potential damage caused by impact or rapid acceleration and deceleration.

Dual-Pair Electrode Embodiment

Figure 6:
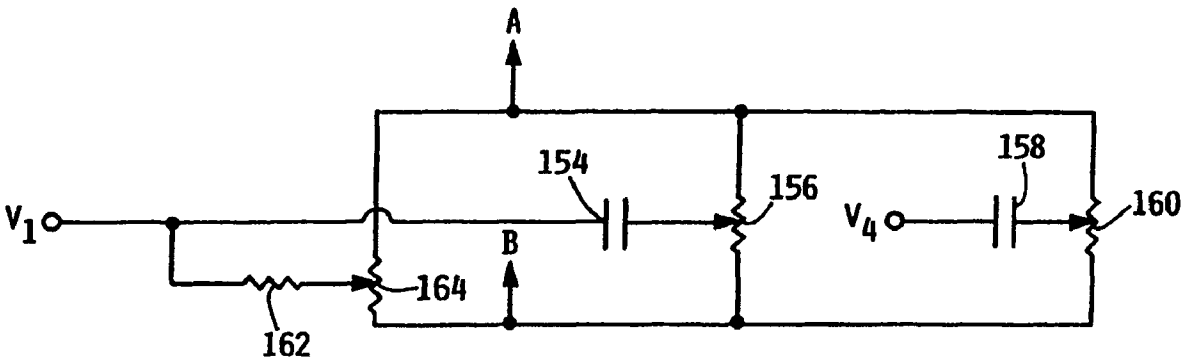
FIG. 6 is a schematic diagram of the tuning module utilized with the principal drive and sensing signal processing circuit of FIG. 5.

Referring particularly to FIGS. 5 and 6, the schematic diagram of the principal drive and sensing signal processing circuit 14 for the angular rate sensor system 10 is shown in which the vibratory sensing element 12 has two pairs of substantially identical or equal outer electrodes, namely first and second electrodes $E_1$, $E_2$ disposed on one face of the vibratory sensing element 12, third and fourth electrodes $E_3$, $E_4$ disposed on the opposing face of the vibratory sensing element 12, and a center electrode $E_c$. (This dual-pair electrode embodiment is similarly represented in the vibratory sensing elements 12 shown in FIGS. 1-4.)

The drive and sensing signal processing circuit 14 of FIG. 5 incorporates an automatic gain control (AGC) 100 having an output 102 and input 104, the AGC 100 providing an essentially constant output signal regardless of variations in the amplitude or level of the input signal. The output 102 of the AGC 100 is connected directly to the center or base electrode $E_c$ of the vibratory sensing element 12.

Output 102 of the AGC 100 is similarly connected through capacitor 106 to the non-inverting input 122 of a first operational amplifier (op amp) 108, the output 126 of which is in turn is connected to the input 104 of the AGC 100. A resistor 110 and ground connection 112 are disposed between the capacitor 106 and the non-inverting input 122 of the first op amp 108. Resistor 114 is connected between the output 126 and the inverting input 124 of the first op amp 108 forming a resistance type negative feedback loop to control the gain of the first op amp 108. A second resistor 116 and ground connection 118 are disposed between the capacitor 106 and first resistor 110 and the non-inverting input 122 of the first op amp 108.

Interposed between the inverting input 124 of the first op amp 106 and the vibratory sensing element 12 is a bank of four resistors 120, each resistor 120 being connected to one of the first through fourth outer electrodes $E_1$, $E_2$, $E_3$, $E_4$. Disposed between each resistor 120 and the corresponding electrode $E_1$-$E_4$ is a connection to a resistor 128 and ground connection 130.

Two outer electrodes $E_2$, $E_3$ located alternately on opposite faces of the vibratory sensing element 12 are connected through respective resistors 132, 134 to the non-inverting input 138 of a second op amp 136. The remaining two diametrically opposed outer electrodes $E_1$, $E_4$ of the vibratory sensing element 12 are connected through respective resistors 144, 146 to the inverting input 140 of the second op amp 136. The connections between the electrodes $E_1$-$E_4$ and the second op amp 136 are each interposed between the associated resistor 128 and the corresponding resistor 120.

The resistors 120 may be adjusted in ratio to one another in order to compensate for variations in the signals for the vibratory sensing element 12 to cancel unbalanced vibrational responses for the drive portion of the drive and sensing signal processing circuit 14. Similarly, resistors 132, 134, 144, and 146 may be adjusted in ratio to one another in order to cancel unbalanced vibrational responses for the sensing portion of the drive and sensing signal processing circuit 14.

The output 142 from the second op amp 136 is in turn connected through capacitor 148 back to the inverting input 140 of the second op amp 136 forming a capacitance type negative feedback loop to control the gain of the second op amp 136, and the non-inverting input 138 of the second op amp 136 is connected through capacitor 150 to ground connection 152.

As such, the inverting inputs 124, 140 of the first and second op amps 108, 136 provide a 180° phase shift to the respective outputs 126, 142, with the non-inverting inputs 122, 138 being in phase with the outputs 126, 142. It should be noted that the normal collector ($V_{cc}$) and emitter ($V_{cc}$) power supply terminals for each of the first and second op amps 108, 136 have been omitted from FIGS. 5 and 7-9.

Referring to FIG. 6, a separate tuning module is shown which may be utilized with the drive and sensing signal processing circuit 14. That tuning module includes a first pair of terminal contacts A, B and a second pair of terminal contacts $V_1$, $V_4$. Terminal contact $V_1$ is electrically connected through capacitor 154 to the wiper (or sliding contact) of first potentiometer 156. Each of the fixed contacts of first potentiometer 156 are connected to one of the fixed contacts of second potentiometer 160. The wiper of second potentiometer 160 is connected through capacitor 158 to terminal contact $V_4$. Similarly, each of the fixed contacts of first potentiometer 156 are connected to one of the fixed contacts of third potentiometer 164. The wiper of third potentiometer 160 is similarly connected through resistor 162 to terminal contact $V_1$. Disposed along the connections between the fixed contacts of the first potentiometer 156 and third potentiometer 164 are terminal contacts A and B. When the terminal contacts A, B, $V_1$, $V_4$ of the tuning module of FIG. 6 are connected to the respective terminals A, B, $V_1$, $V_4$ of the drive and sensing signal processing circuit 14 of FIG. 5, the first, second, and third potentiometers 156, 160, 164 provide manual tuning and compensation for bias, temperature, and quadrature, respectively.

The automatic gain control 100 and operational amplifiers 108, 136 may be of any type commonly utilized for these purposes, representative examples being discussed in U.S. Pat. No. 4,479,098. Suitable values for the various resistance and capacitance components for the tuning module of FIG. 6 and drive and sensing signal processing circuit 14 of FIG. 5 are illustrated in Table I. These values are for illustrative purposes only in describing a specific embodiment constructed according to the principles of the subject invention, and the values may vary widely depending upon the particular application, environment, and other operational considerations, and those values may readily be appreciated by one or ordinary skill in the art of designing such angular rate sensing systems 10.

TABLE I

| Component | Value |
|---|---|
| R128 | 1K Ω |
| R110 | 2.5K Ω |
| R120 | 10K Ω |
| R132, 134, 144, 146 | 10K Ω |
| R114 | 20K Ω |
| R116 | 20K Ω |
| R162 | 1M Ω |
| C106, 148, 150 | 100 ρF |
| C154, 158 | 10 ρF |

In the dual-pair electrode embodiment the first and third electrodes $E_1$, $E_3$ confront, overlap, and are aligned with one another across the vibratory sensing element 12, and the second and fourth electrodes $E_2$, $E_4$ are similarly disposed confronting, overlapping, and aligned with one another across the vibratory sensing element 12.

Shared Driving and Sensing Embodiment

Referring particularly to FIG. 7, the schematic diagram of an alternate drive and sensing signal processing circuit 14 for the angular rate sensor system 10 is shown in which the vibratory sensing element 12 again has two pairs of substantially identical or equal outer electrodes, namely first and second electrodes $E_1$, $E_2$ disposed on one face of the vibratory sensing element 12, third and fourth electrodes $E_3$, $E_4$ disposed on the opposing face of the vibratory sensing element 12, and a center electrode $E_c$.

The drive and sensing signal processing circuit 14 of FIG. 7 incorporates an automatic gain control (AGC) 200 having an output 202 and input 204. The output 202 of the AGC 200 is connected directly to the center or base electrode $E_c$ of the vibratory sensing element 12.

Input 204 of the AOC 200 is connected to the output 212 of first op amp 206, with the output 202 of the AGC 200 being connected back through capacitor 246 to the non-inverting input 208 of the first op amp 206. A resistor 248 and ground connection 250 are disposed between the capacitor 246 and the non-inverting input 208 of the first op amp 206.

Resistor 254 is connected between the output 212 and the inverting input 210 of the first op amp 206 forming a resistance type negative feedback loop to control the gain of the first op amp 206.

The second and third electrodes $E_2$, $E_3$ of the vibratory sensing element 12 are connected together and to the inverting input 210 of the first op amp 206 through resistor 242, while the first and fourth electrodes $E_1$, $E_4$ are similarly connected together and to the inverting input 210 of the first op amp 206 through resistor 244.

The second and third electrodes $E_2$, $E_3$ are similarly connected to the inverting input 218 of a second op amp 214 through resistor 228, while the first and fourth electrodes $E_1$, $E_4$ are connected together and to the non-inverting input 216 of the second op amp 214 through resistor 258.

Disposed between the pair of electrodes $E_2$, $E_3$ is a connection through resistor 234 to ground connection 236, and similarly disposed between the pair of electrodes $E_1$, $E_4$ is a connection through resistor 238 to ground connection 240.

The output 220 from the second op amp 214 is in mm connected through resistor 252 back to the inverting input 218 of the second op amp 214 forming a resistance type negative feedback loop to control the gain of the second op amp 214, and the non-inverting input 216 of the second op amp 214 is connected through resistor 230 to ground connection 232.

The output 220 from the second op amp 214 is further connected to the input of a 90° phase shift means 222, whose output is in turn connected to a demodulator 224. One output from the demodulator 224 is connected to the input of a low pass filter 226, while the remaining output from the demodulator 224 is connected to the output 202 of the AGC 200 and through capacitor 246 to the non-inverting input 208 of the first op amp 206. The output from the low pass filter 226 provides an output signal at the signal processing circuit output 256.

In this shared driving and sensing embodiment of the signal processing circuit 14, the four outer electrodes $E_1$-$E_4$ each detect the same angular rate, but with corresponding opposite signs. The average of the output signals from each of the outer electrodes $E_1$-$E_4$ corresponds to the driving motion and the first op amp 206 utilizes that average signal to generate the drive signal. The difference between the output signals from the pairs of outer electrodes $E_1$-$E_4$ is used by the second op amp 214 to produce an output signal whose amplitude is proportional to the angular rate of the vibratory sensing element 12.

As with the principal embodiment of the signal processing circuit 14, this shared driving and sensing embodiment may be easily constructed from staple components, and is substantially free from fatigue limitations. The signal processing circuit 14 is relatively insensitive to frequency changes, has a greater available bandwidth than previous tuning fork or vibrating beam type angular rate sensors, and has negligible magnetic sensitivity. It should be noted that signal processing is initiated with a minute signal that roust be amplified significantly and shifted 90°, thereby permitting sources of error and drift to arise in the output signal. It may also be necessary in some applications to compensate for the capacitance of the particular piezoceramic material from which the vibratory sensing element 12 is fabricated in order to maintain drive resonance. Cross talk between the sense and drive signals can occur and will be temperature variable, with noise and bias change resulting from that cross talk. The resistance will usually lower the level of the output signal considerably, and the signal processing circuit 14 may therefore be subject to noise and component drift. Some noise and drift could be alleviated by substituting an integrator circuit or differential integrator for the differential amplifier to initially process the sensing signal, which reduces noise at higher frequencies and produces an output signal having a stable 90° phase shift.

Partially Shared Driving and Sensing Embodiment

Figure 8:
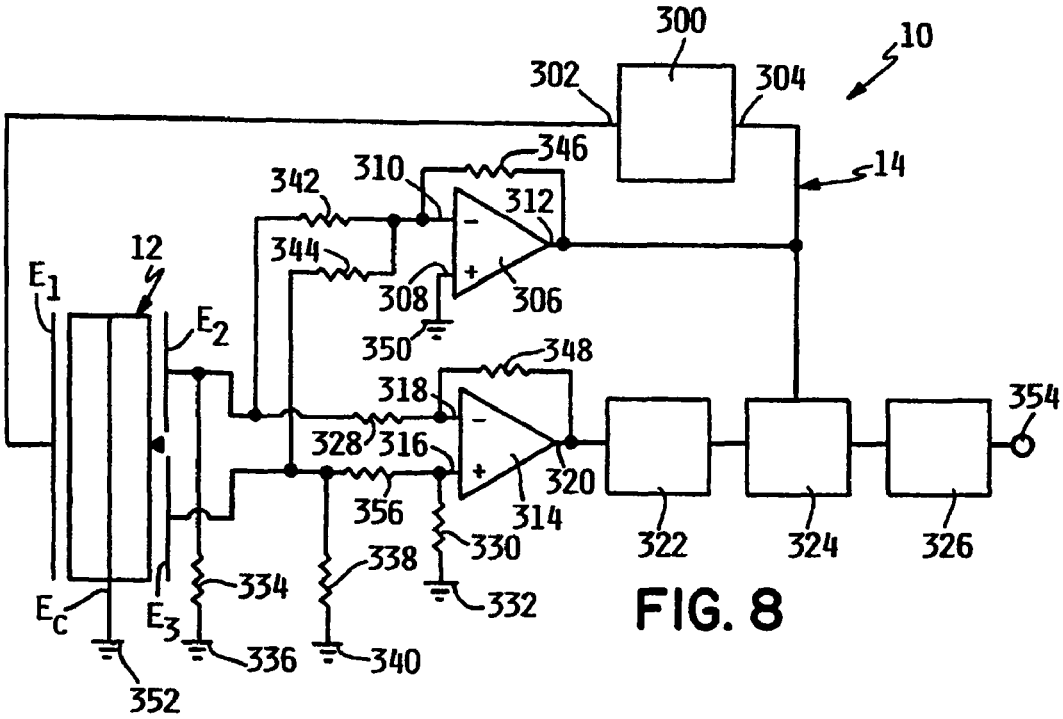
FIG. 8 is a schematic diagram of a partially shared drive and sensing embodiment of the signal processing circuit for use with a single-pair electrode embodiment of the vibratory sensing element.

Referring particularly to FIG. 8, the schematic diagram of an alternate drive and sensing signal processing circuit 14 for the angular rate sensor system 10 is shown in which the vibratory sensing element 12 has one single electrode $E_1$ on the first face of the vibratory sensing element 12, a pair of second and third outer electrodes $E_2$, $E_3$ on the face of the vibratory sensing element 12 opposing the single outer electrode $E_1$, and a center or fourth electrode $E_c$. The second and third electrodes $E_2$, $E_3$ are disposed next to each other and each confronts, overlaps, and is aligned with one of a pair of distinct portions or segments of the first electrode $E_1$, those portions or segments being generally equal in size and comprising approximately one half the area of the first electrode $E_1$.

The drive and sensing signal processing circuit 14 of FIG. 8 again incorporates an AGC 300 having an output 302 and input 304, the output 302 being connected directly to the single outer electrode $E_1$ of the vibratory sensing element 12.

Input 304 of the AGC 300 is connected to the output 312 of first op amp 306, with the output 312 of the first op amp 306 being connected back through resistor 346 to the inverting input 310 of the first op amp 306 to form a resistance type negative feedback loop to control the gain of the first op amp 306. The non-inverting input 308 of the first op amp 306 is connected directly to ground connection 350.

The second electrode $FE_2$ is connected to the inverting input 310 of the first op amp 306 through resistor 342, while the third electrode $E_3$ is similarly connected to the inverting input 310 of the first op amp 306 through resistor 344.

The second electrode $E_2$ is connected through resistor 328 to the inverting input 318 of second op amp 314, while the third electrode $E_3$ is similarly connected through resistor 356 to the non-inverting input 316 of the second op amp 314.

Disposed between the second electrode $F_2$ and resistor 342 is a connection through resistor 334 to ground connection 336, and similarly disposed between the third electrode $E_3$ and resistor 344 is a connection through resistor 338 to ground connection 340. Disposed between the inverting input 316 of the second op amp 314 and resistor 356 is a connection through resistor 330 to ground connection 332. The center electrode $E_c$ is connected directly to ground connection 352. As previously noted with respect to the circuit shown in FIG. 5, the pairs of resistors 342, 344, and 328, 356 may similarly be adjusted or tuned in order to cancel unbalanced vibrational responses for the drive and sensing signal processing circuit 14.

The output 320 from the second op amp 314 is in turn connected through resistor 348 back to the non-inverting input 318 of the second op amp 314 forming a resistance type negative feedback loop to control the gain of the second op amp 314. The output 320 from the second op amp 314 is further connected to the input of a 90° phase shift means 322, whose output is in turn connected to demodulator 324. One output from demodulator 324 is connected to the input of low pass filter 326, while the remaining output from demodulator 324 is connected to the input 304 of the AGC 300 and the output 312 of the first op amp 306. The output from the low pass filter 326 provides an output signal at the signal processing circuit output 354.

Construction of this partially shared driving and sensing embodiment is simplified compared to the dual-pair electrode embodiment, since one less manufacturing step is involved to fabricate the electrodes $E_1$-$E_3$ on the vibratory sensing element 12,, and one less lead is physically attached to the vibratory sensing element 12. The partial isolation of the driving and sensing functions in this embodiment greatly reduces system noise and eliminates the need to compensate for capacitance of the piezoelectric material. While only half the force is available to drive the vibratory sensing element 12, the high Q-value of the piezoceramic material and vibratory sensing element 12 as a whole normally permit the use of a relatively low voltage drive signal, and a higher drive voltage can be used to compensate for the reduction in drive area. The output signal is similarly reduced by half, thereby requiring amplification, and this may increase the effect of some noise and bias components. Finally, the symmetry of the vibratory sensing element 12 is disturbed, which may be a consideration in some applications.

Totally Isolated Driving and Sensing Embodiment

Figure 9:
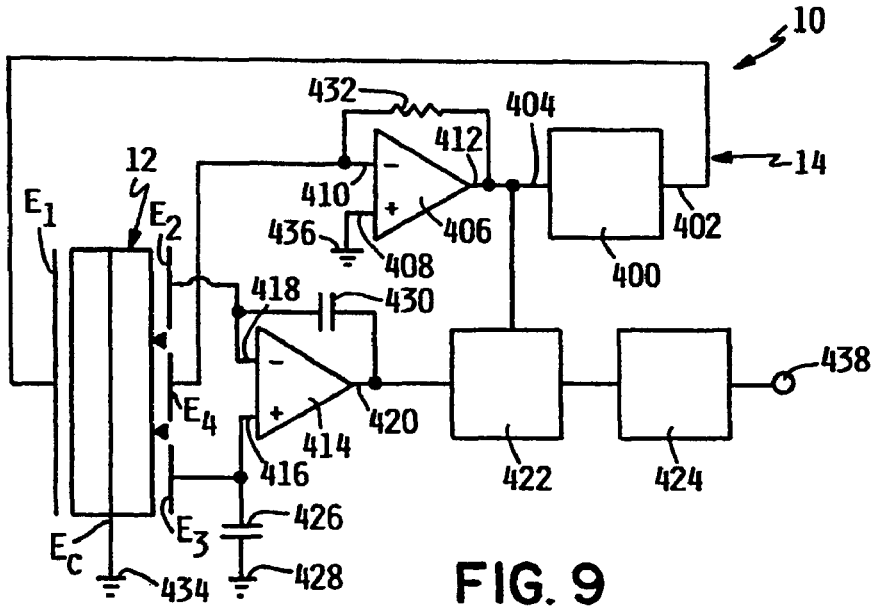
FIG. 9 is a schematic diagram of a totally isolated drive and sensing embodiment of the signal processing circuit for use with a single-triple electrode embodiment of the vibratory sensing element.

Referring particularly to FIG. 9, the schematic diagram of an alternate drive and sensing signal processing circuit 14 is shown in which the vibratory sensing element 12 has one single electrode $E_1$ on the first face of the vibratory sensing element 12, second, third, and fourth outer electrodes $E_2$, $E_2$, $E_4$ on the face of the vibratory sensing element 12 opposing the single outer electrode $E_1$, and a center electrode $E_c$. The third electrode $E_3$ is disposed between and may be slightly narrower than the second and fourth electrodes $E_2$, $E_4$, which are generally identical to one another. The second, third, and fourth electrodes $E_2$, $E_3$, $E_4$ each confront, overlap, and are aligned with distinct portions or segments of the first electrode $E_1$, those portions or segments confronting the second and third electrodes $E_2$, $E_3$ being generally equal in size to one another and comprising approximately one third or more the area of the first electrode $E_1$, the portion or segment confronting the fourth electrodes $E_4$ thus comprising approximately one third or less the area of the first electrode $E_1$.

The drive and sensing signal processing circuit 14 of FIG. 9 again incorporates an AGC 400 having an output 402 and input 404, the output 402 being connected directly to the single outer electrode $E_1$ of the vibratory sensing.

The input 404 of the AGC 400 is connected to the output 412 of first op amp 406, with the output 412 of the first op amp 406 being connected back through resistor 432 to the inverting input 410 of the first op amp 406 to form a resistance type negative feedback loop to control the gain of the first op amp 406. The non-inverting input 408 of the first op amp 406 is connected directly to ground connection 436.

The fourth electrode $E_4$ is connected directly to the inverting input 410 of first op amp 406. The second electrode $E_2$ is connected directly to the inverting input 418 of the second op amp 414, while the third electrode $E_3$ is similarly connected directly to the non-inverting input 416 of the second op amp 414. The center electrode $E_c$ is connected directly to ground connection 434.

Disposed between the fourth electrode $E_4$ and the non-inverting input 416 of the second op amp 414 is a connection through capacitor 426 to ground connection 428. The output 420 from the second op amp 414 is in turn connected through resistor capacitor 430 back to the non-inverting input 418 of the second op amp 414 forming a capacitance type negative feedback loop to control the gain of the second op amp 414. As previously noted with respect to the circuit shown in FIG. 5, the pair of capacitors 426, 430 may similarly be adjusted or tuned in order to cancel unbalanced vibrational responses for the drive and sensing signal processing circuit 14.

The output 420 from the second op amp 414 is further connected to the input of demodulator 422. One output from demodulator 422 is connected to the input of low pass filter 424, while the remaining output from demodulator 422 is connected to the input 404 of the AGC 400 and the output 412 of the first op amp 406. The output from the low pass filter 424 provides an output signal at the signal processing circuit output 438.

It may be appreciated that one could readily interchange the second and fourth electrodes $E_2$, $E_4$ within this totally isolated embodiment. This embodiment requires fewer components than the partially shared driving and sensing embodiment discussed above, however an additional manufacturing step is required in fabricating the vibratory sensing element 12, and a fifth lead must be physically connected to the vibratory sensing element 12. This totally isolated embodiment permits sensing to be accomplished freely with the lowest noise, and drive sensing is fully independent from angular rate sensing. The symmetry of the vibratory sensing element 12 is further diminished, however the wide separation between drive and sense resonance under normal operating conditions should render any consideration of symmetry non-critical or inconsequential.

Figure 10:
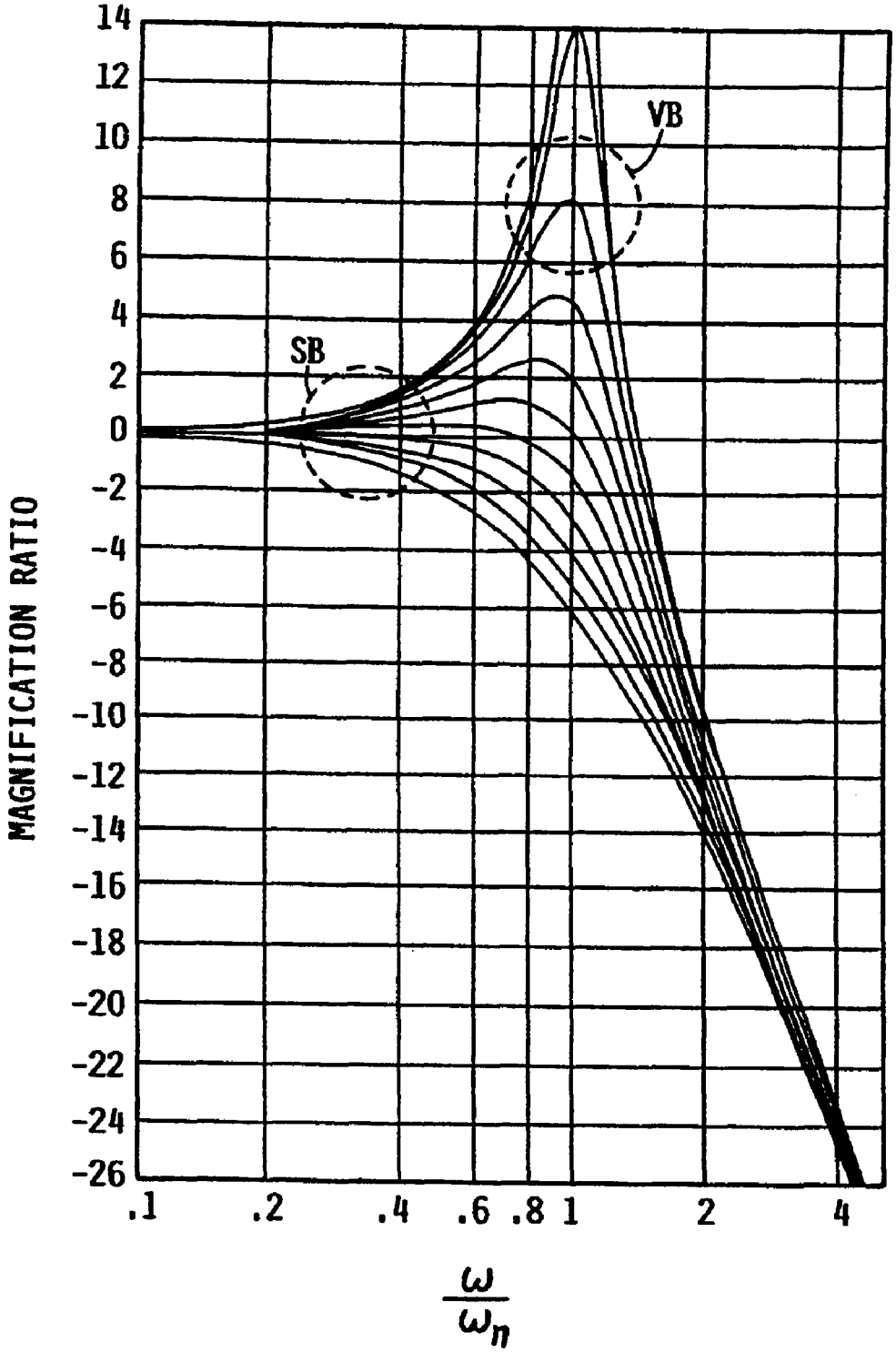
FIG. 10 is a chart of the amplitude response in a driven and damped second-order harmonic system showing the magnification ratio as a function of the ratio of drive frequency $\omega$ over natural resonant frequency $\omega_n$ for various damping ratios $\zeta$.

Referring to FIG. 10, the normal amplitude response curve for a driven and damped second-order harmonic system is shown, with each of the charted lines representing a different damping ratio $\zeta$. In FIG. 10, the y-axis denotes the magnification ratio in decibels (db), and the x-axis denotes the ratio of drive frequency $\omega$ over the natural resonant frequency $\omega_n$. The highest chart line which is interrupted by the top margin of the chart reflects an undamped system, and the lowest chart line reflects a damped system having a damping ratio $\zeta$ of one.

Figure 11:
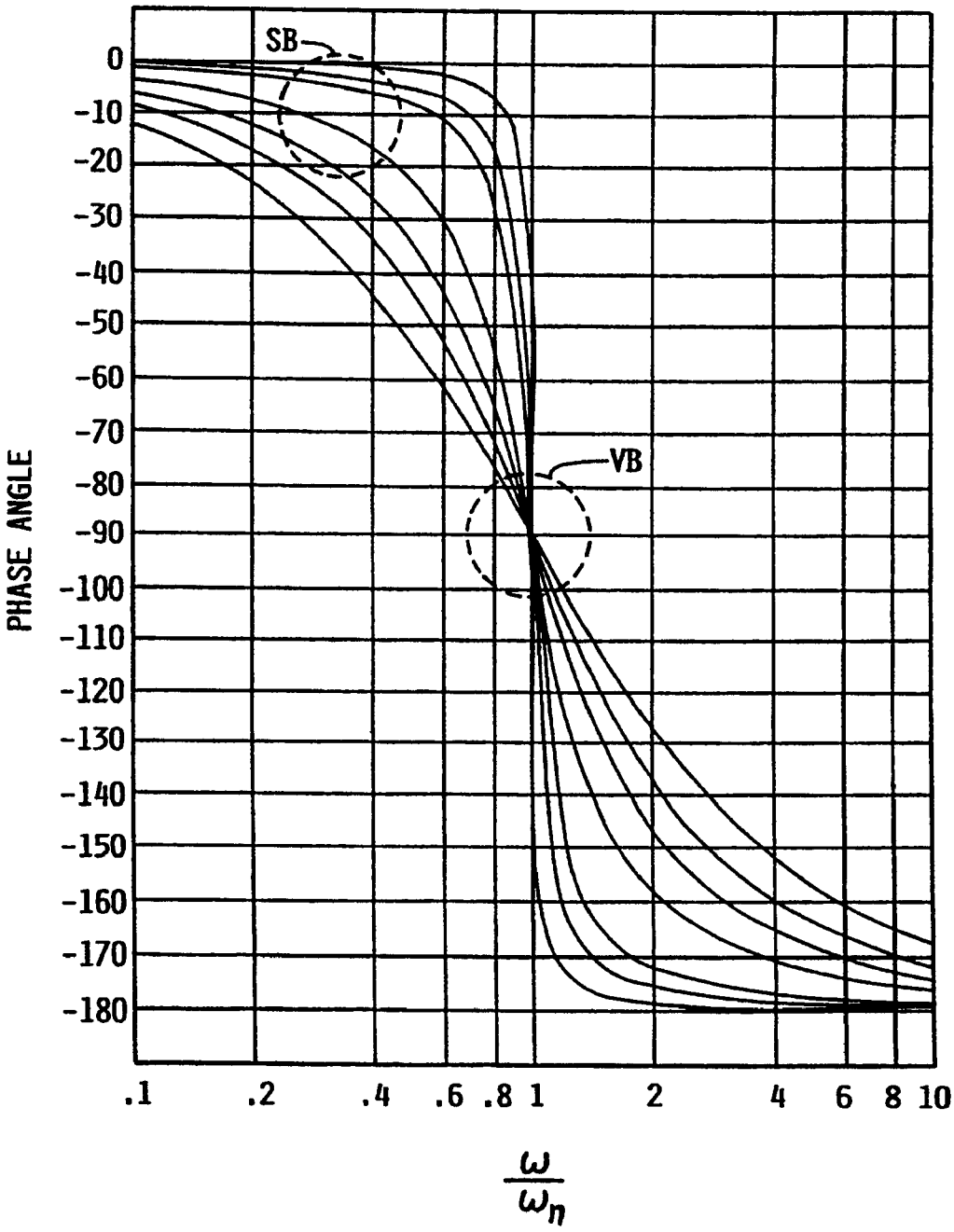
FIG. 11 is a chart of the phase response in a driven and damped second-order harmonic system showing the phase angle $\phi$ as a function of the ratio of drive frequency $\omega$ over natural resonant frequency $\omega_n$ for various damping ratios $\zeta$.

Referring to FIG. 11, the normal phase response curve for the same driven and damped second-order harmonic system is shown, with each of the charted lines again representing a different damping ratio $\zeta$. In FIG. 11, the y-axis denotes the phase angle $\phi$ in degrees, while the x-axis similarly denotes the ratio of drive frequency $\omega$ over the natural resonant frequency $\omega_n$. The chart lines converge at a phase angle $\phi$ of −90° when the drive frequency $\omega$ equals the natural resonant frequency $\omega_\eta$. The chart line closest to vertical at the point of convergence reflects an undamped system, while the chart line furthest from vertical at the point of convergence reflects a damped system having a damping ratio $\zeta$ of one. The chart lines theoretically converge beyond the side margins of the chart in FIG. 11.

Referring to FIG. 10, it may be seen that conventional vibrating beam type angular rate sensors (designated VB) such as the types disclosed in Tehon '195 and implemented in the General Electric Vyro ® inertial rate sensor or the triangular cross-section core discussed above and implemented by Mura Tech, operate with a driving frequency $\omega$ nearly equal to the natural resonant frequency $\omega_\eta$ (and therefore the sensing frequency). As such, the result is a high magnification ratio (on the order of 10 db), whereas the single element angular rate sensor (designated SB) disclosed herein can easily shift the ratio $\omega/\omega_\eta$ to approximately 0.4 (when driving at 4 kHz or less and sensing at 10 kHz or greater, for example) or below, thus pulling the magnification ratio downward to a point below 2 db and effectively nearing 0 db.

Similarly, in FIG. 11, it may be seen that conventional vibrating beam type angular rate sensors (VB) typically operate with a phase angle $\phi$ at or near $-90°$, whereas the single element angular rate sensing system (SB) disclosed herein provides a phase angle $\phi$ on the order of $-10°$.

It may be appreciated that each of the embodiments of the angular rate sensor system 10 fabricated according to the guidelines set forth above will have a characteristic Q-value associated therewith, which will be further affected by the particular nature and physical properties of the materials utilized in constructing each embodiment. It is understood that through the selection of appropriate and suitable materials for specified applications, and the tuning or adjustment of the associated drive and sensing signal processing circuit 14, the sensing frequency for the angular rate sensor system 10 may be related to and optimized for the particular characteriztic Q-value associated with that system 10.

While the preferred embodiments of the above angular rate sensor system 10 have been described in detail with reference to the attached drawing Figures, it is understood that various changes and adaptations may be made in the angular rate sensor system 10 without departing from the spirit and scope of the appended claims.

What is claimed is:

1. An angular rate sensor system which may be used with a signal processing circuit to discriminate an angular rate, the angular rate sensor system comprising:

*a mounting structure; and* a vibratory sensing element including a *substantially planar* base electrode *presenting a pair of opposing sides*, at least two layers of piezoelectric material each disposed on *and substantially covering the* opposing sides of the base electrode, a first outer electrode disposed on a first side of the vibratory sensing element, and a second outer electrode disposed on a second side of the vibratory sensing element opposing the first side, the first outer electrode and the second outer electrode being oriented generally parallel with a plane, the vibratory sensing element defining a pair of *natural* acoustic nodes when vibrated in a direction of vibration oriented generally perpendicular to the plane, the vibratory sensing element being suspended *from the mounting structure* proximate [to] *each of* the pair of natural acoustic nodes *so as to vibrate in the direction of vibration*, said angular rate sensor system further comprising a third outer electrode, the third outer electrode being disposed on the first side of the vibratory sensing element and oriented generally parallel with the plane, and a fourth outer electrode, the fourth outer electrode being disposed on the second side of the vibratory sensing element and oriented generally parallel with the plane,

[whereby] *wherein* the vibratory sensing element vibrates in the direction of vibration oriented generally perpendicular to the plane when either the first electrode or the second electrode are excited by a drive signal, and further [whereby] *wherein* the first electrode or the second electrode produce sensing signals responsive and proportional to the angular rate of the vibratory sensing element, the signal processing circuit discriminating the angular rate from the sensing signals.

2. The angular rate sensor system of claim 1 wherein the vibratory sensing element is generally rectangular and has a length, a width, and a thickness, the length being generally greater than the width, and the width being generally greater than the thickness.

3. The angular rate sensor system of claim 2 wherein the length is approximately six times the width, and wherein the width is approximately three times the thickness.

4. The angular rate sensor system of claim 1 wherein the vibratory sensing element further defines a plurality of edgewise faces disposed around a perimeter surface of the vibratory sensing element and generally parallel with the direction of vibration, each of the plurality of edgewise faces of the perimeter surface having no further electrodes disposed thereon oriented perpendicular to the plane.

5. The angular rate sensor system of claim 1 wherein the vibratory sensing element further defines a plurality of edgewise faces disposed around a perimeter surface of the vibratory sensing element and generally parallel with the direction of vibration, and wherein the base electrode extends outwardly toward and adjacent to each of the plurality of edgewise faces of the perimeter surface.

6. The angular rate sensor system of claim 1 wherein the signal processing circuit includes a first operational amplifier and a second operational amplifier, each of the first operational amplifier and the second operational amplifier having an inverting input, a non-inverting input, and an output, and wherein each of the first outer electrode, the second outer electrode, the third outer electrode, and the fourth outer electrode are electrically connected to the inverting input of the first operational amplifier, and wherein the first outer electrode and the fourth outer electrode are electrically connected to the inverting input of the second operational amplifier, and the second outer electrode and the third outer electrode are electrically connected to the non-inverting input of the second operational amplifier.

7. The angular rate sensor system of claim 6 wherein the first outer electrode is generally parallel with and confronts the second outer electrode across the vibrating sensing element, and wherein the fourth outer electrode is generally parallel with and confronts the third outer electrode across the vibrating sensing element.

8. The angular rate sensor system of claim 6 wherein the output of the first operational amplifier is electrically connected to the base electrode.

9. The angular rate sensor system of claim 6 wherein the signal processing circuit further includes an automatic gain control having an input and an output, and wherein the output of the first operational amplifier is electrically connected to the input of the automatic gain control and the output from the automatic gain control is electrically connected to the base electrode.

10. The angular rate sensor system of claim 9 wherein the output of the automatic gain control is electrically connected to the non-inverting input of the first operational amplifier.

11. The angular rate sensor system of claim 9 wherein each of the first outer electrode, the second outer electrode, the third outer electrode, and the fourth outer electrode are electrically connected to a ground connection.

12. The angular rate sensor system of claim 9 wherein the non-inverting input of the first operational amplifier and the non-inverting input of the second operational amplifier are each electrically connected to a ground connection.

13. The angular rate sensor of claim 6 wherein the signal processing circuit includes a negative feedback loop electrically connected between the output of the first operational amplifier and the inverting input of the first operational amplifier.

14. The angular rate sensor of claim 6 wherein the signal processing circuit includes a negative feedback loop electrically connected between the output of the second operational amplifier and the inverting input of the second operational amplifier.

15. The angular rate sensor system of claim 14 wherein the negative feedback loop is of the capacitance type.

16. The angular rate sensor of claim 6 wherein the signal processing circuit includes a first contact disposed between and electrically connected to the inverting input of the second operational amplifier and the fourth outer electrode, a second contact disposed between and electrically connected to the non-inverting input of the second operational amplifier and the third outer electrode, a third contact electrically connected to the output of the first operational amplifier, and fourth contact electrically connected to the base electrode, the signal processing circuit further comprising:

a tuning module including a first potentiometer having a wiper contact and a pair of fixed contacts, a second potentiometer having a wiper contact and a pair of fixed contacts, and a third potentiometer having a wiper contact and a pair of fixed contacts, the wiper contact of the first potentiometer being electrically connected to the third contact and to the wiper contact of the second potentiometer, each one of the pair of fixed contacts of the first potentiometer being electrically connected to a one of the pair of fixed contacts of the second potentiometer to a one of the pair of fixed contacts of the third potentiometer, the wiper contact of the third potentiometer being electrically connected to the fourth contact, a first one of each of the pair of fixed contacts of the first potentiometer and the second potentiometer and the third potentiometer being electrically connected to the first contact, and a second one of each of the pair of fixed contacts of the first potentiometer and the second potentiometer and the third potentiometer being electrically connected to the second contact.

17. The angular rate sensor system of claim 1 wherein the signal processing circuit includes a first operational amplifier and a second operational amplifier, each of the first operational amplifier and the second operational amplifier having an inverting input, a non-inverting input, and an output, and wherein each of the first outer electrode, the second outer electrode, the third outer electrode, and the fourth outer electrode are electrically connected to the inverting input of the first operational amplifier, and wherein the first outer electrode and the fourth outer electrode are electrically connected to the non-inverting input of the second operational amplifier, and the second outer electrode and the third outer electrode are electrically connected to the inverting input of the second operational amplifier.

18. The angular rate sensor system of claim 17 wherein the first outer electrode is generally parallel with and confronts the second outer electrode across the vibrating sensing element, and wherein the second outer electrode is generally parallel with and confronts the third outer electrode across the vibrating sensing element.

19. The angular rate sensor system of claim 17 wherein the output of the first operational amplifier is electrically connected to the base electrode.

20. The angular rate sensor system of claim 17 wherein the signal processing circuit further includes an automatic gain control having an input and an output, and wherein the output of the first operational amplifier is electrically connected to the input of the automatic gain control and the output from the automatic gain control is electrically connected to the base electrode.

21. The angular rate sensor system of claim 20 wherein the output of the second operational amplifier is electrically connected to both the output of the automatic gain control and the inverting input of the first operational amplifier.

22. The angular rate sensor system of claim 20 wherein each of the first outer electrode, the second outer electrode, the third outer electrode, and the fourth outer electrode are each electrically connected to a ground connection through first, second, third, and fourth resistors, respectively.

23. The angular rate sensor system of claim 20 wherein the non-inverting input of the first operational amplifier and the non-inverting input of the second operational amplifier are each electrically connected to a ground connection.

24. The angular rate sensor system of claim 17 wherein the signal processing circuit includes a negative feedback loop electrically connected between the output of the first operational amplifier and the inverting input of the first operational amplifier.

25. The angular rate sensor system of claim 17 wherein the signal processing circuit includes a negative feedback loop electrically connected between the output of the second operational amplifier and the inverting input of the second operational amplifier.

26. The angular rate sensor system of claim 25 wherein the negative feedback loop is of the capacitance type.

27. The angular rate sensor system of claim 17 wherein the signal processing circuit includes an automatic gain control having an input and an output, a phase shifting means having an input and an output, a demodulator having an input, a first output, and a second output, and a low pass filter having an input and an output, and further wherein the output of the second operational amplifier is electrically connected to the input of the phase shifting means, the output of the phase shifting means is electrically connected to the input of the demodulator, the first output of the demodulator is electrically connected to both the output of the automatic gain control and the non-inverting input of the first operational amplifier, and the second output of the demodulator is electrically connected to the low pass filter.

28. The angular rate sensor system of claim 1 wherein said signal processing circuit includes means for driving the vibratory sensing element at a drive frequency and wherein the vibratory sensing element has a sensing frequency, the sensing frequency being greater than the drive frequency.

29. The angular rate sensor system of claim 28 in which the sensing frequency is at least two times greater than the drive frequency.

30. The angular rate sensor system of claim 28 wherein the sensing frequency is on an order of approximately 10 kHz or greater and the drive frequency is on an order of approximately 4 kHz or less.

31. The angular rate sensor system of claim 28 wherein the sensing frequency is greater than the drive frequency by approximately twenty percent or more.

32. The angular rate sensor system of claim 28 wherein the angular ram sensor system has a characteristic Q-value associated therewith, and wherein the sensing frequency is generally related to and optimized for said characteristic Q-valve.

33. The angular rate sensor system of claim 1 wherein the vibratory sensing [dement] *element* has a length, a width, and a thickness, the length being substantially greater than the width.

34. The angular rate sensor system of claim 33 wherein the length of the vibratory sensing element is on the order of approximately 1.18".

35. The angular rate sensor system of claim 33 wherein the width of the vibratory sensing element is on the order of approximately 0.12".

36. The angular rate sensor system of claim 33 wherein the thickness of the vibratory sensing element is on the order of approximately 0.04".

37. The angular rate sensor system of claim 1 wherein the at least two layers of piezoelectric material include a first layer and a second layer opposing the first layer, the vibratory sensing element further comprises:

a first inner conductive layer disposed between the base electrode and the first layer; and a second inner conductive layer disposed between the base electrode and the second layer.

38. The angular rate sensor system of claim 37 wherein the first inner conductive layer and the second inner conductive layer are each fabricated from a thin layer of silver.

39. The angular rate sensor system of claim 1 wherein the first outer electrode and the second outer electrode are each fabricated from a thin layer of silver.

40. The angular rate sensor system of claim 1 wherein the base electrode is fabricated from a material selected from a group including brass and Kovar ®.

41. The angular rate sensor system of claim 1 wherein the base electrode is fabricated from brass and each of the pair of acoustic nodes of the vibratory sensing element is a natural acoustic node.

42. The angular rate sensor system of claim 1 wherein the vibration of the vibratory sensing element in the direction of vibration is a non-resonant oscillation.

43. An angular rate sensor system which may be used with a signal processing circuit to discriminate an angular rate, the angular rate sensor system comprising:

*a mounting structure; and* a vibratory sensing element including a *substantially planar* base electrode *presenting a pair of opposing sides*, at least two layers of piezoelectric material each disposed on *and substantially covering the* opposing sides of the base electrode, a first outer electrode disposed on a first side of the vibratory sensing element, and a second outer electrode digitised on a second side of the vibratory sensing element opposing the first side, the first outer electrode and the second outer electrode being oriented generally parallel with a plane, the vibratory sensing element defining a pair of *natural* acoustic nodes when vibrated in a direction of vibration oriented generally perpendicular to the plane, the vibratory sensing element being suspended *from the mounting structure* proximate [to] *each of* the pair of natural acoustic nodes *so as to vibrate in the direction of vibration*, said system further comprising:

a third outer electrode, the third outer electrode being disposed on the second side of the vibratory sensing element,

[whereby] *wherein* the vibratory sensing element vibrates in the direction of vibration oriented generally perpendicular to the plane when either the first electrode or the second electrode are excited by a drive signal, and further [whereby] *wherein* the first electrode or the second electrode produce sensing signals responsive and proportional to the angular rate of the vibratory sensing element, the signal processing circuit discriminating the angular rate from the sensing signals.

44. The angular rate sensor system of claim 43 wherein the signal processing circuit includes a first operational amplifier and a second operational amplifier, each of the first operational amplifier and the second operational amplifier having an inverting input, a non-inverting input, and an output, and wherein the second outer electrode and the third outer electrode are electrically connected to the inverting input of the first operational amplifier, and wherein the second outer electrode is electrically connected to the inverting input of the second operational amplifier, and the third outer electrode is electrically connected to the non-inverting input of the second operational amplifier.

45. The angular rate sensor system of claim 43 wherein the second outer electrode is generally parallel with and confronts a first portion of the first outer electrode across the vibrating sensing element, and wherein the third outer electrode is generally parallel with and confronts a second portion of the rust outer electrode across the vibrating sensing element.

46. The angular rate sensor system of claim 45 wherein the first outer electrode has an area and wherein the first portion and the second portion of the first outer electrode are distinct from one another and each extends over approximately one half of the area of the first electrode.

47. The angular rate sensor system of claim 44 wherein the output of the first operational amplifier is electrically connected to the first electrode.

48. The angular rate sensor system of claim 44 wherein the signal processing circuit further includes an automatic gain control having an input and an output, and wherein the output of the first operational amplifier is electrically connected to the input of the automatic gain control and the output from the automatic gain control is electrically connected to the first electrode.

[49. The angular rate sensor system of claim 44 wherein each of the first outer electrode, the second outer electrode, and the base electrode are each connected to a ground connection.]

50. The angular rate sensor system of claim [49] *44* wherein the non-inverting input of the first operational amplifier and the non-inverting input of the second operational amplifier are each electrically connected to a ground connection.

51. The angular rate sensor system of claim 44 wherein the signal processing circuit includes a negative feedback loop electrically connected between the output of the first operational amplifier and the inverting input of the first operational amplifier.

52. The angular rate sensor system of claim 44 wherein the signal processing circuit includes a negative feedback loop electrically connected between the output of the second operational amplifier and the inverting input of the second operational amplifier.

53. The angular rate sensor system of claim 44 wherein the signal processing circuit includes an automatic gain control having an input and an output, a phase shifting means having an input and an output, a demodulator having an input, a first output, and a second output, and a low pass filter having an input and an output, and further wherein the output of the second operational amplifier is electrically connected to the input of the phase shifting means, the output of the phase shifting means is electrically connected to the input of the demodulator, the first output of the demodulator is electrically connected to both the input of the automatic gain control and the output of the first operational amplifier, and the second output of the demodulator is electrically connected to the low pass filter.

54. An angular rate sensor system which may be used with a signal processing circuit to discriminate an angular rate, the angular rate sensor system comprising:

*a mounting structure; and* a vibratory sensing element including a *substantially planar* base electrode *presenting a pair of opposing sides*, at least two layers of piezoelectric material each disposed on *and substantially covering the* opposing sides of the base electrode, a first outer electrode disposed on a first side of the vibratory sensing element, and a second outer electrode disposed on a second side of the vibratory sensing element opposing the first side, the first outer electrode and the second outer electrode being oriented generally parallel with a plane, the vibratory sensing element defining a pair of *natural* acoustic nodes when vibrated in a direction of vibration oriented generally perpendicular to the plane, the vibratory sensing element being suspended *from the mounting structure* proximate [to] *each of* the pair of natural acoustic nodes *so as to vibrate in the direction of vibration*, said system further comprising:

a third outer electrode and a fourth outer electrode, the third outer electrode and fourth outer electrode each being disposed on the second side of the vibratory sensing element,

[whereby] *wherein* the vibratory sensing element vibrates in the direction of vibration oriented generally perpendicular to the plane when either the first electrode or the second electrode are excited by a drive signal, and further [whereby] *wherein* the first electrode or the second electrode produce sensing signals responsive and proportional to the angular rate of the vibratory sensing element, the signal processing circuit discriminating the angular rate from the sensing signals.

55. The angular rate sensor system of claim 54 wherein the fourth outer electrode is disposed between the second outer electrode and the third outer electrode.

56. The angular rate sensor system of claim 54 wherein the signal processing circuit includes a first operational amplifier and a second operational amplifier, each of the first operational amplifier and the second operational amplifier having an inverting input, a non-inverting input, and an output, and wherein the second outer electrode is electrically connected to the inverting input of the second operational amplifier, the third outer electrode is electrically connected to the non-inverting input of the second operational amplifier, and the fourth outer electrode is electrically connected to the inverting input of the first operational amplifier.

57. The angular rate sensor system of claim 54 wherein the second outer electrode is generally parallel with and confronts a first portion of the first outer electrode across the vibrating sensing element, the third outer electrode is generally parallel with and confronts a second portion of the first outer electrode across the vibrating sensing element, and the fourth outer electrode is generally parallel with and confronts a third portion of the first outer electrode across the vibrating sensing element.

58. The angular rate sensor system of claim 43 wherein the first outer electrode has an area and wherein the first portion and the third portion of the first outer electrode are distinct from one another and each extend over approximately one third or more of the area of the first electrode, and wherein the second portion of the first outer electrode is distinct from the first portion and the third portion of the first outer electrode and extends over approximately one third or less of the area of the first electrode.

59. The angular rate sensor system of claim 56 wherein the output of the first operational amplifier is electrically connected to the first electrode.

60. The angular rate sensor system of claim 56 wherein the signal processing circuit further includes an automatic gain control having an input and an output, and wherein the output of the first operational amplifier is electrically connected to the input of the automatic gain control and the output from the automatic gain control is electrically connected to the first electrode.

61. The angular rate sensor system of claim 54 wherein the third outer electrode and the base electrode are each connected to a ground connection.

62. The angular rate sensor system of claim 61 wherein:

the first outer electrode has an area and wherein the first portion and the third portion of the first outer electrode each extend over approximately one third or more of the area of the first electrode, and wherein the second portion of the first outer electrode extends over approximately one third or less of the area of the first electrode;

the signal processing circuit includes a first operational amplifier and a second operational amplifier, each of the first operational amplifier and the second operational amplifier having an inverting input, a non-inverting input, and an output, and wherein the second outer electrode is electrically connected to the inverting input of the second operational amplifier, the third outer electrode is electrically connected to the non-inverting input of the second operational amplifier, and the fourth outer electrode is electrically connected to the inverting input of the first operational amplifier; and wherein the non-inverting input of the first operational amplifier and the non-inverting input of the second operational amplifier are each electrically connected to a ground connection.

63. The angular rate sensor system of claim 56 wherein the signal processing circuit includes a negative feedback loop electrically connected between the output of the first operational amplifier and the inverting input of the first operational amplifier.

64. The angular rate sensor system of claim 59 wherein the signal processing circuit includes a negative feedback loop electrically connected between the output of the second operational amplifier and the inverting input of the second operational amplifier.

65. The angular rate sensor system of claim 64 wherein the negative feedback loop is of the capacitance type.

66. The angular rate sensor system of claim 54 wherein the signal processing circuit includes an automatic gain control having an input and an output, a demodulator having an input, a first output, and a second output, and a low pass filter having an input and an output, and further wherein the output of the second operational amplifier is electrically connected to the input of the demodulator, the first output of the demodulator is electrically connected to both the input of the automatic gain control and the output of the first operational amplifier, and the second output of the demodulator is electrically connected to the low pass filter.

67. An angular rate sensor system which may be used with a signal processing circuit to discriminate an angular rate, the angular rate sensor system comprising:

a vibratory sensing element including a base electrode, at least two layers of piezoelectric material each disposed on opposing sides of the base electrode, a first outer electrode disposed on a first side of the vibratory sensing element, and a second outer electrode disposed on a second side of the vibratory sensing element opposing the first side, the first outer electrode and the second outer electrode being oriented generally parallel with a plane, the vibratory sensing element defining a pair of acoustic nodes when vibrated in a direction of vibration oriented generally perpendicular to the plane, the vibratory sensing element being suspended proximate to the pair of natural acoustic nodes, whereby the vibratory sensing element vibrates in the direction of vibration oriented generally perpendicular to the plane when either the first electrode or the second electrode are excited by a drive signal, and further whereby the first electrode or the second electrode produce sensing signals responsive and proportional to the angular rate of the vibratory sensing element, the signal processing circuit discriminating the angular rate from the sensing signals; *said angular rate sensor system further comprising a third outer electrode, the third outer electrode being disposed on the first side of the vibratory sensing element and oriented generally parallel with the plane, and a fourth outer electrode, the fourth outer electrode being disposed on the second side of the vibratory sensing element and oriented generally parallel with the plane,* wherein the vibratory sensing [dement] *element* has a first acoustic node and a second acoustic node spaced apart from the first acoustic node, the angular rate sensor system further comprising:

a mounting structure; the mounting structure being attached to the vibratory sensing element proximate to each of the first acoustic node and the second acoustic node, the vibratory sensing element being suspended on the mounting structure so as to vibrate in the direction of vibration, wherein the mounting structure comprises:

a frame member defining an opening within which the vibratory sensing element is received, the opening having a first edge and a second edge;

a first pair of filaments; and a second pair of filaments, each of the first pair of filaments and the second pair of filaments being connected to and extending from the first edge to the second edge and receiving the vibratory sensing element therebetween, the first pair of filaments being generally aligned along and parallel with the first acoustic node, the second pair of filaments being generally aligned along and parallel with the second acoustic node.

68. The angular rate sensor system of claim 67 wherein each of the first pair of filaments and the second pair of filaments have two opposing ends, at least one of the two opposing ends of the first pair of filaments being crossed over one another to form a first flexure point, and at least one of the two opposing ends of the second pair of filaments being crossed over one another to form a second flexure point.

69. An angular rate sensor system which may be used with a signal processing circuit to discriminate an angular rate, the angular rate sensor system comprising:

a vibratory sensing element including a base electrode, at least two layers of piezoelectric material each disposed on opposing sides of the base electrode, a first outer electrode disposed on a first side of the vibratory sensing element, and a second outer electrode disposed on a second side of the vibratory sensing element opposing the first side, the first outer electrode and the second outer electrode being oriented generally parallel with a plane, the vibratory sensing element defining a pair of acoustic nodes when vibrated in a direction of vibration oriented generally perpendicular to the plane, the vibratory sensing element being suspended proximate to the pair of natural acoustic nodes, *said angular rate sensor system further comprising a third outer electrode, the third outer electrode being disposed on the first side of the vibratory sensing element and oriented generally parallel with the plane, and a fourth outer electrode, the fourth outer electrode being disposed on the second side of the vibratory sensing element and oriented generally parallel with the plane,* whereby the vibratory sensing element vibrates in the direction of vibration oriented generally perpendicular to the plane when either the first electrode or the second electrode are excited by a drive signal, and further whereby the first electrode or the second electrode produce sensing signals responsive and proportional to the angular rate of the vibratory sensing element, the signal processing circuit discriminating the angular rate from the sensing signals;

wherein the vibratory sensing element has a first acoustic node and a second acoustic node spaced apart from the first acoustic node, the angular rate sensor system further comprising:

a mounting structure, the mounting structure being attached to the vibratory sensing element proximate to each of the first acoustic node and the second acoustic node, the vibratory sensing element being suspended on the mounting structure so as to vibrate in the direction of vibration, wherein the mounting structure further comprises:

a first plate member spaced apart from and disposed on a first side of the vibratory sensing element and defining a first pair of support arms extending inwardly toward the vibratory sensing element; and a second plate member spaced apart from and disposed on a second side of the vibratory sensing element opposing the first side and defining a second pair of support arms extending inwardly toward the vibratory sensing element, the first pair of support arms being connected to the vibratory sensing element proximate to the first acoustic node, and the second pair of support arms being connected to the vibratory sensing element proximate to the second acoustic node.

70. The angular rate sensor system of claim 69 wherein the vibratory sensing element has a first edgewise face and a second edgewise face oriented generally perpendicular to both the first acoustic node and the second acoustic node and to the plane, the first pair of support arms each oriented at a generally acute angle relative to the first edgewise face of the vibratory sensing element, the second pair of support arms each oriented at a generally acute angle relative to the second edgewise face of the vibratory sensing element.

71. The angular rate sensor system of claim 69 wherein the first pair of support arms are each oriented at a generally acute angle relative to the first acoustic node, and the second pair of support arms are each oriented at a generally acute angle relative to the second acoustic node.

72. An angular rate sensor system which may be used with a signal processing circuit to discriminate an angular rate, the angular rate sensor system comprising:

a vibratory sensing element including a base electrode, at least two layers of piezoelectric material each disposed on opposing sides of the base electrode, a first outer electrode disposed on a first side of the vibratory sensing element, and a second outer electrode disposed on a second side of the vibratory sensing element opposing the first side, the first outer electrode and the second outer electrode begins oriented generally parallel with a plate, the vibratory sensing element defining a pair of acoustic nodes when vibrated in a direction of vibration oriented generally perpendicular to the plane, the vibratory sensing element being suspended proximate to the pair of natural acoustic nodes, *said angular rate sensor system further comprising a third outer electrode, the third outer electrode being disposed on the first side of the vibratory sensing element and oriented generally parallel with the plane, and a fourth outer electrode, the fourth outer electrode being disposed on the second side of the vibratory sensing element and oriented generally parallel with the plane,* whereby the vibratory sensing element vibrates in the direction of vibration oriented generally perpendicular to the plane when either the first electrode or the second electrode are excited by a drive signal, and further whereby the first electrode or the second electrode produce sensing signals responsive and proportional to the angular rate of the vibratory sensing element, the signal processing circuit discriminating the angular rate from the sensing signals;

wherein the vibratory sensing element has a first acoustic node and a second acoustic node spaced apart from the first acoustic node, the angular rate sensor system further comprising:

a mounting structure, the mounting structure being attached to the vibratory sensing element proximate to each of the first acoustic node and the second acoustic node, the vibratory sensing element being suspended on the mounting structure so as to vibrate in the direction of vibration, wherein the vibratory sensing element has a length, a width, and a thickness, the length being generally greater than the width, and further wherein the mounting structure has a first stiffness in a longitudinal direction parallel with the length of the vibratory sensing element, and the mounting structure has a second stiffness in a lateral direction parallel with the width of the vibratory sensing element.

73. The angular rate sensor system of claim 72 wherein the first stiffness of the mounting structure in the longitudinal direction differs from the second stiffness of the mounting structure in the lateral direction.

74. The angular rate sensor system of claim 72 wherein the first stiffness of the mounting structure in the longitudinal direction and the second stiffness of the mounting structure in the lateral direction are predetermined.

*75. An angular rate sensor system which may be used with a signal processing circuit to discriminate an angular rate, the angular rate sensor system comprising:*

*a mounting structure; and*

*a vibratory sensing element having opposing first and second sides and including at least two layers of piezoelectric material with at least one layer of conductive material disposed therebetween, the vibratory sensing element further including a first outer conductive layer on the first side and substantially coextensive therewith and a second outer conductive layer on the second side and substantially coextensive therewith, the first and second outer conductive layers being oriented generally parallel with a plane, wherein the first outer conductive layer comprises a first electrode, wherein the second outer conductive layer comprises second and third electrodes, and wherein the vibratory sensing element defines at least a pair of acoustic nodes when vibrated in a direction of vibration oriented generally perpendicular to the plane, the vibratory sensing element being suspended from the mounting structure proximate each of the pair of acoustic nodes so as to vibrate in the direction of vibration,*

*wherein the vibratory sensing element vibrates in the direction oriented generally perpendicular to the plane if at least one of the first, second or third electrodes is excited by a drive signal, and further wherein at least one of the first, second or third electrodes produces sensing signals responsive and proportional to the angular rate of the vibratory sensing element, the signal processing circuit discriminating the angular rate from the sensing signals.*

*76. The angular rate sensor system of claim 75, wherein the second electrode is generally parallel with and confronts a first portion of the first electrode across the vibrating sensing element, and wherein the third electrode is generally parallel with and confronts a second portion of the first electrode across the vibrating sensing element.*

*77. The angular rate sensor system of claim 76, wherein the first electrode has an area and wherein the first portion and the second portion of the first electrode are distinct from one another and each extends over approximately one half of the area of the first electrode.*

*78. The angular rate sensing system of claim 75, wherein the signal processing circuit includes a first operational amplifier and a second operational amplifier, each of the first operational amplifier and the second operational amplifier having an inverting input, a non-inverting input, and an output, and wherein the second electrode and the third electrode are electrically connected to the inverting input of the first operational amplifier, and wherein the second electrode is electrically connected to the inverting input of the second operational amplifier, and the third electrode is electrically connected to the non-inverting input of the second operational amplifier.*

*79. The angular rate sensor system of claim 78, wherein the output of the first operational amplifier is electrically connected to the first electrode.*

*80. The angular rate sensor system of claim 78, wherein the signal processing circuit further includes an automatic gain control having an input and an output, and wherein the output of the first operational amplifier is electrically connected to the input of the automatic gain control and the output from the automatic gain control is electrically connected to the first electrode.*

*81. The angular rate sensing system of claim 78, wherein the at least one layer of conductive material disposed between the at least two layers of piezoelectric material comprises a center electrode electrically connected to ground.*

*82. The angular rate sensor system of claim 81 wherein the first electrode and the second electrode are each electrically connected to ground.*

*83. The angular rate sensor system of claim 81, wherein the vibratory sensing element further defines a plurality of edge-*

*wise faces disposed around a perimeter surface of the vibratory sensing element and generally parallel with the direction of vibration, and wherein the center electrode extends outwardly toward and adjacent to each of the plurality of edgewise faces of the perimeter surface.*

*84. An angular rate sensor system for discriminating an angular rate comprising:*

*a mounting structure; and*

*a vibratory sensing element comprising a plurality of piezoelectric layers, each piezoelectric layer having a pair of opposing generally planar surfaces, each surface having a layer of conductive material over at least a portion thereof, the piezoelectric layers opposingly stacked so that the conductive layer on at least one of the surfaces of each piezoelectric layer opposes and is electrically connected with the conductive layer on at least one of the surfaces of an adjacent piezoelectric layer, the electrically connected conductive layers of adjacent piezoelectric layers comprising a center electrode, at least one of the surfaces of each at least two of the piezoelectric layers facing outwardly defining first and second opposing sides of the vibratory sensing element, the first and second opposing sides being oriented generally parallel with a plane, the conductive layer on the first side comprising at least a first outer electrode and the conductive layer on the second side comprising second and third outer electrodes, wherein the vibratory sensing element defines at least a pair of natural acoustic nodes when vibrated in a direction of vibration oriented generally perpendicular to the plane, the vibratory sensing element being suspended from the mounting structure proximate each of the pair of acoustic nodes so as to vibrate in the direction of vibration, the system further comprising a signal processing circuit including a first operational amplifier and a second operational amplifier, each of the first operational amplifier and the second operational amplifier having an inverting input, a non-inverting input, and an output, and wherein the outer second electrode and the third outer electrode are electrically connected to the inverting input of the first operational amplifier, and wherein the second outer electrode is electrically connected to the inverting input of the second operational amplifier, and the third outer electrode is electrically connected to the non-inverting input of the second operational amplifier.*

*85. The angular rate sensor system of claim 84, wherein the output of the first operational amplifier is electrically connected to the first outer electrode.*

*86. The angular rate sensor system of claim 84, wherein the signal processing circuit further includes an automatic gain control having an input and an output, and wherein the output of the first operational amplifier is electrically connected to the input of the automatic gain control and the output from the automatic gain control is electrically connected to the first outer electrode.*

*87. The angular rate sensor system of claim 84, wherein the vibratory sensing element further defines a plurality of edgewise faces disposed around a perimeter surface of the vibratory sensing element and generally parallel with the direction of vibration, and wherein the center electrode extends outwardly toward and adjacent to each of the plurality of edgewise faces of the perimeter surface.*

* * * * *